(12) United States Patent
Tajima et al.

(10) Patent No.: US 8,735,875 B2
(45) Date of Patent: May 27, 2014

(54) LIGHT EMITTING ELEMENT, METHOD FOR MANUFACTURING LIGHT EMITTING ELEMENT, IMAGE DISPLAY DEVICE, AND ILLUMINATING DEVICE

(75) Inventors: Masaru Tajima, Chiba (JP); Kanjiro Sako, Chiba (JP); Katsumasa Hirose, Chiba (JP); Kunio Kondo, Chiba (JP)

(73) Assignee: Showa Denko K.K., Tokyo (JP)

( * ) Notice: Subject to any disclaimer, the term of this patent is extended or adjusted under 35 U.S.C. 154(b) by 98 days.

(21) Appl. No.: 13/386,334

(22) PCT Filed: May 26, 2010

(86) PCT No.: PCT/JP2010/058932
§ 371 (c)(1),
(2), (4) Date: Jan. 20, 2012

(87) PCT Pub. No.: WO2011/010503
PCT Pub. Date: Jan. 27, 2011

(65) Prior Publication Data
US 2012/0267614 A1    Oct. 25, 2012

(30) Foreign Application Priority Data

Jul. 21, 2009 (JP) ................................. 2009-170609

(51) Int. Cl.
*H01L 29/08* (2006.01)

(52) U.S. Cl.
USPC .................. 257/40; 257/88; 257/98; 257/103; 257/E51.018; 257/E51.026

(58) Field of Classification Search
USPC ......... 257/40, 88, 98, 103, E51.018, E51.026
See application file for complete search history.

(56) References Cited

U.S. PATENT DOCUMENTS

| | | |
|---|---|---|
| 6,414,104 B1 | 7/2002 | Pei |
| 6,593,687 B1 | 7/2003 | Pei et al. |
| 2001/0053843 A1 | 12/2001 | Pei |
| 2002/0122144 A1 | 9/2002 | Yoshida et al. |
| 2003/0091862 A1 | 5/2003 | Tokito et al. |
| 2003/0094897 A1 | 5/2003 | Koyama et al. |
| 2004/0217702 A1 | 11/2004 | Garner et al. |

(Continued)

FOREIGN PATENT DOCUMENTS

| | | |
|---|---|---|
| JP | 08-157575 A | 6/1996 |
| JP | 08-288069 A | 11/1996 |

(Continued)

OTHER PUBLICATIONS

Yutaka Ohmori, "Recent Development of Highly Efficient Organic EI Materials", Oyo Buturi, Dec. 2001, pp. 1419-1425, vol. 70, No. 12.

(Continued)

*Primary Examiner* — Andy Huynh
(74) *Attorney, Agent, or Firm* — Sughrue Mion, PLLC

(57) ABSTRACT

Provided is a light-emitting element having light emitting sections (17) that are distributed on a transparent substrate (11). Specifically, an electroluminescence element (10) includes the substrate having a bored part (16b) which is formed by recessing, below the light emitting sections, the surface of the substrate on a light emitting section side. By this configuration, the light-emitting element has a high light-emitting efficiency and exhibits required light distribution characteristics by controlling a direction of emitted light.

37 Claims, 20 Drawing Sheets

(56) References Cited

U.S. PATENT DOCUMENTS

| | | |
|---|---|---|
| 2004/0247934 A1 | 12/2004 | Takeuchi et al. |
| 2006/0051616 A1 | 3/2006 | Suzuki et al. |
| 2006/0269779 A1 | 11/2006 | Takahashi et al. |
| 2007/0155928 A1 | 7/2007 | Koyama et al. |
| 2007/0194704 A1 | 8/2007 | Koyama |
| 2008/0152947 A1 | 6/2008 | Takeuchi et al. |
| 2008/0217648 A1 | 9/2008 | Ohara |
| 2008/0219005 A1 | 9/2008 | Fukuda et al. |
| 2008/0238295 A1 | 10/2008 | Takei et al. |
| 2008/0290792 A1 | 11/2008 | Takeuchi et al. |
| 2008/0290793 A1 | 11/2008 | Takeuchi et al. |
| 2009/0212303 A1 | 8/2009 | Toerker et al. |
| 2011/0018023 A1* | 1/2011 | Mikami .................. 257/98 |

FOREIGN PATENT DOCUMENTS

| | | |
|---|---|---|
| JP | 09-190883 A | 7/1997 |
| JP | 10-001665 A | 1/1998 |
| JP | 2000-034476 A | 2/2000 |
| JP | 2002-198167 A | 7/2002 |
| JP | 2002-367784 A | 12/2002 |
| JP | 2003-113246 A | 4/2003 |
| JP | 2003-119179 A | 4/2003 |
| JP | 2003-133057 A | 5/2003 |
| JP | 2003-147021 A | 5/2003 |
| JP | 2003-171391 A | 6/2003 |
| JP | 2003-206320 A | 7/2003 |
| JP | 2003-522371 A | 7/2003 |
| JP | 2003-342325 A | 12/2003 |
| JP | 2007-086639 A | 4/2004 |
| JP | 2004-346312 A | 12/2004 |
| JP | 2005-097589 A | 4/2005 |
| JP | 2005-174914 A | 6/2005 |
| JP | 2005-302308 A | 10/2005 |
| JP | 2006-076901 A | 3/2006 |
| JP | 2006-273792 A | 10/2006 |
| JP | 2006-303412 A | 11/2006 |
| JP | 2008-218296 A | 9/2008 |
| JP | 2008-251531 A | 10/2008 |
| WO | 2006/002668 A1 | 1/2006 |
| WO | WO 2008/102866 A1 | 8/2008 |

OTHER PUBLICATIONS

Extended European Search Report dated Sep. 30, 2013 for counterpart European Patent Application No. EP 10802124.7.

* cited by examiner

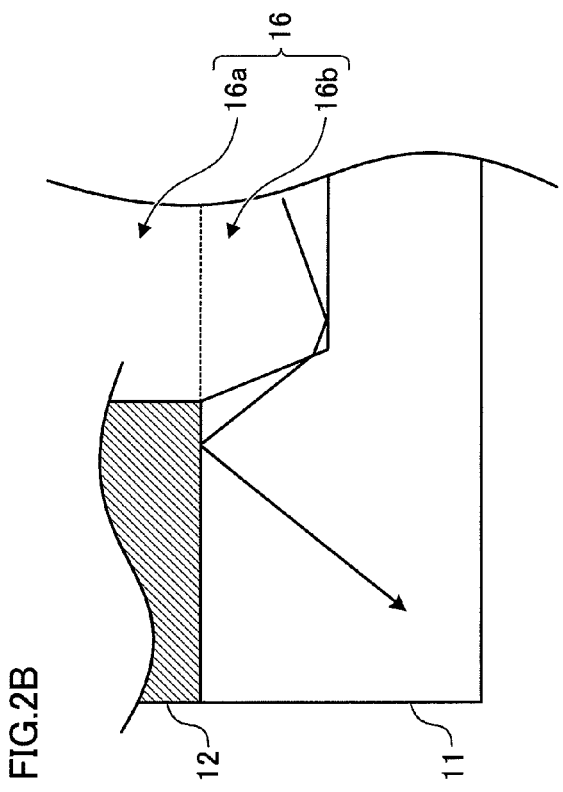
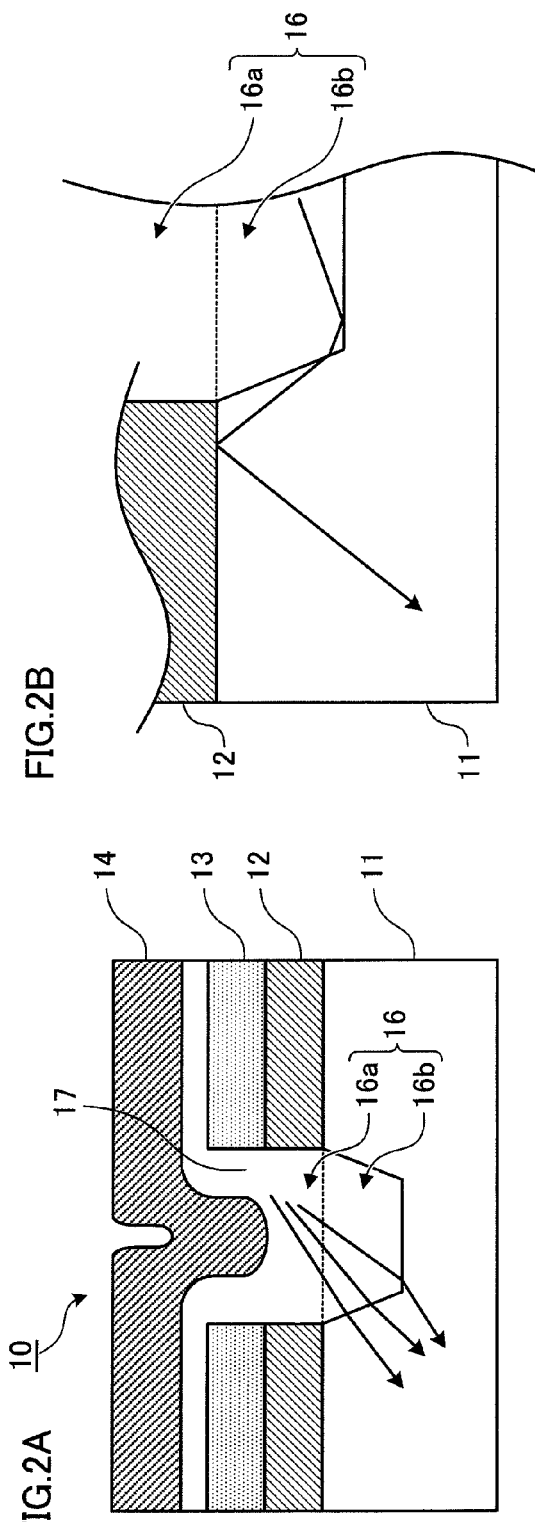
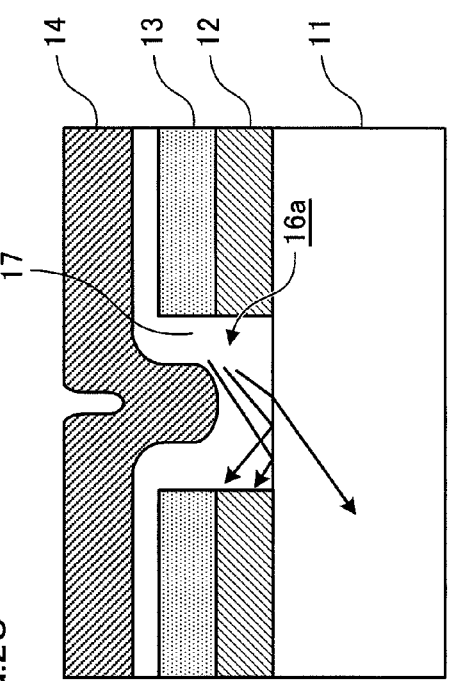

LIGHT EMITTING ELEMENT, METHOD FOR MANUFACTURING LIGHT EMITTING ELEMENT, IMAGE DISPLAY DEVICE, AND ILLUMINATING DEVICE

TECHNICAL FIELD

The present invention relates to a light emitting element or the like used for, for example, an image display device or an illuminating device.

BACKGROUND ART

In recent years, devices utilizing the electroluminescence phenomenon have increased in importance. As such a device, a light emitting element such as an electroluminescence element, in which light-emitting materials are formed to be a light-emitting layer, and a pair of electrodes including an anode and a cathode is attached to the light-emitting layer, and light is emitted by applying voltage thereto, becomes a focus of attention. In this kind of electroluminescence element, a hole and an electron are injected from the anode and the cathode, respectively, by applying voltage between the anode and the cathode, and an energy generated by coupling the injected electron and hole in the light-emitting layer is used to perform light emission. In other words, the electroluminescence element is a device utilizing a phenomenon in which the light-emitting material in the light-emitting layer is excited by the energy produced by the coupling, and light is emitted when an excited state returns to a ground state again.

In a case where the light emitting element such as the electroluminescence element is used as an image display device, since the light-emitting material is capable of self-emitting, the device has characteristics that a speed of response as the image display device is fast and a view angle is wide. Further, due to its structural feature of the electroluminescence element, there is an advantage that the thickness of the image display device may be reduced with ease. Moreover, in a case of an organic electroluminescence element using, for example, an organic substance as the light-emitting material, characteristics are obtained such that light with high color purity is readily obtained depending upon selection of the organic substance, and thereby a wide color gamut is available.

Further, since the light emitting element such as the electroluminescence element is capable of emitting white light, and is an area light source, a use of the electroluminescence element to be incorporated into an illuminating device is suggested.

As an example of the aforementioned light emitting element, Patent Document 1, for example, suggests a cavity-emission electroluminescence device including a dielectric layer interposed between a hole-injecting and electron-injecting electrode layers, in which an internal cavity extends through at least the dielectric layer and one of the electrode layers and includes a hole-injecting electrode region, an electron-injecting electrode region and a dielectric region, and an electroluminescence coating material is applied to the surface of the internal cavity.

CITATION LIST

Patent Literature

Patent Document 1: Japanese Patent Application Unexamined Publication (Translation of PCT Application) No. 2003-522371

DISCLOSURE OF INVENTION

Technical Problem

In general, a light emitting element having light emitting sections distributed on a substrate, such as a cavity-emission electroluminescence device, is easy to increase outcoupling efficiency since light emitted from an electroluminescence coating material is made to be directly extracted through the cavity. However, when the light is intended to be extracted from the substrate side, the outcoupling efficiency is decreased in some cases since reflection is easy to occur on the surface of the substrate depending on an angle of the light incident to the substrate.

An object of the present invention is to provide a light emitting element, such as an electroluminescence element, which inhibits reflection on the surface of the substrate when the light emitted from the light emitting section is extracted on the substrate side and has high light-emitting efficiency. Another object of the present invention is to provide a light emitting element having required light distribution characteristics by controlling a direction of output light.

Further object of the present invention is to provide an image display device having high contrast, resolution, light-emitting efficiency, and preferable light distribution characteristics.

Furthermore object of the present invention is to provide an illuminating device having high light-emitting efficiency and preferable light distribution characteristics.

Solution to Problem

To address the aforementioned problems, the present invention is provided with following configurations.

According to a first aspect of the present invention, there is provided a light-emitting element having a substrate that is transparent and on which plural light emitting sections are distributed, the light-emitting element including: a bored part which is included in the substrate, and is formed by recessing, below a light emitting section, a surface of the substrate on a light emitting section side.

According to a second aspect of the present invention, in the first aspect of the light-emitting element, the number of the plural light emitting sections formed on the surface of the substrate per 1 $mm^2$ is not less than $10^2$.

According to a third aspect of the present invention, in the first aspect of the light-emitting element, the substrate includes plural bored parts, and each of the plural bored parts is formed below each of the plural light emitting sections on a one-to-one basis.

According to a fourth aspect of the present invention, in the first aspect of the light-emitting element, the bored part has a tapered shape at least in a part of an area portion from the surface of the substrate to a deepest portion of the bored part.

According to a fifth aspect of the present invention, in the fourth aspect of the light-emitting element, the tapered shape has a width that becomes continuously narrower.

According to a sixth aspect of the present invention, in the fourth aspect of the light-emitting element, the tapered shape has a width that becomes continuously wider.

According to a seventh aspect of the present invention, in the first aspect of the light-emitting element, a width of the bored part is approximately the same from the surface of the substrate to a deepest portion of the bored part.

According to an eighth aspect of the present invention, in the first aspect of the light-emitting element, a deepest portion of the bored part is a plane surface.

According to a ninth aspect of the present invention, in the first aspect of the light-emitting element, a deepest portion of the bored part is a curved surface.

According to a tenth aspect of the present invention, in the first aspect of the light-emitting element, a deepest portion of the bored part has a pointed shape end.

According to an eleventh aspect of the present invention, in the first aspect of the light-emitting element, the bored part has a convex bottom.

According to a twelfth aspect of the present invention, in the first aspect of the light-emitting element, the bored part is formed into a cylinder-like shape.

According to a thirteenth aspect of the present invention, in the first aspect of the light-emitting element, the bored part is formed into a shape other than a solid of revolution.

According to a fourteenth aspect of the present invention, in the seventh aspect of the light-emitting element, the bored part is formed into a cuboid-like shape.

According to a fifteenth aspect of the present invention, in the third aspect of the light-emitting element, the plural bored parts are aligned with each other on the surface of the substrate so that plural long sides are approximately in parallel to each other.

According to a sixteenth aspect of the present invention, in the first aspect of the light-emitting element, a maximum width of the bored part at the surface of the substrate is in a range of 0.01 μm to 5 μm.

According to a seventeenth aspect of the present invention, in the sixteenth aspect of the light-emitting element, the maximum width of the bored part at the surface of the substrate is not less than 0.01 μm and is less than 1 μm.

According to an eighteenth aspect of the present invention, in the first aspect of the light-emitting element, a refractive index of the substrate is less than a refractive index of the plural light emitting sections.

According to a nineteenth aspect of the present invention, in the first aspect of the light-emitting element, the light-emitting element is an electroluminescence element.

According to a twentieth aspect of the present invention, in the nineteenth aspect of the light-emitting element, the plural light emitting sections include a luminescent material made of an organic compound.

According to a twenty-first aspect of the present invention, in the twentieth aspect of the light-emitting element, the plural light emitting sections include a luminescent material made of an organic metal complex.

According to a twenty-second aspect of the present invention, in the twentieth aspect of the light-emitting element, the plural light emitting sections include an organic material emitting phosphorescent light.

According to a twenty-third aspect of the present invention, in the nineteenth aspect of the light-emitting element, there is further provided: a first electrode layer that is stacked on the substrate, and a second electrode layer that is stacked above the first electrode layer; and a penetrating part that is formed on the bored part and penetrates the first electrode layer from the bored part. The plural light emitting sections are each included in the penetrating part.

According to a twenty-fourth aspect of the present invention, in the twenty-third aspect of the light-emitting element, a dielectric layer is formed between the first electrode layer and the second electrode layer.

According to a twenty-fifth aspect of the present invention, in the twenty-third aspect of the light-emitting element, the penetrating part further penetrates the second electrode layer.

According to a twenty-sixth aspect of the present invention, in the twenty-third aspect of the light-emitting element, a width of the penetrating part is not more than 10 μm.

According to a twenty-seventh aspect of the present invention, in the twenty-third aspect of the light-emitting element, a maximum width of the penetrating part is in a range of 0.01 μm to 5 μm.

According to a twenty-eighth aspect of the present invention, in the twenty-third aspect of the light-emitting element, the width of the penetrating part coincides with a width of the bored part.

According to a twenty-ninth aspect of the present invention, in the twenty-third aspect of the light-emitting element, the penetrating part is formed into a cylinder-like shape.

According to a thirtieth aspect of the present invention, in the twenty-third aspect of the light-emitting element, the penetrating part is formed into a cuboid-like shape.

According to a thirty-first aspect of the present invention, in the thirtieth aspect of the light-emitting element, the penetrating part is aligned with other penetrating parts on the surface of the substrate so that plural long sides are approximately in parallel to each other.

According to a thirty-second aspect of the present invention, in the twenty-third aspect of the light-emitting element, a sidewall that spreads from the penetrating part to the bored part is formed in a continuous surface.

According to a thirty-third aspect of the present invention, in the twenty-third aspect of the light-emitting element, at least one of the first electrode layer and the second electrode layer is made of an opaque material.

According to a thirty-fourth aspect of the present invention, there is provided a manufacturing method of the light-emitting element according to the first aspect, including: a stacking process for stacking at least a first electrode layer and a dielectric layer on a transparent substrate; a penetrating part forming process for forming a penetrating part that penetrates at least the first electrode layer and the dielectric layer; a bored part forming process for forming a bored part on the substrate by using, as a mask, a part of the layers other than a part where the penetrating part is formed; a light emitting section forming process for forming a light emitting section on an interior surface inside of the penetrating part; and a second electrode layer forming process for forming a second electrode layer.

According to a thirty-fifth aspect of the present invention, in the thirty-fourth aspect of the manufacturing method of the light-emitting element, the second electrode layer forming process is a process for forming the second electrode layer on the light emitting section.

According to a thirty-sixth aspect of the present invention, in the thirty-fourth aspect of the manufacturing method of the light-emitting element, at least one of the penetrating part forming process and the bored part forming process is a process for forming corresponding one of the penetrating part and the bored part by dry etching.

According to a thirty-seventh aspect of the present invention, there is provided an image display device including the light-emitting element according to the first aspect.

According to a thirty-eighth aspect of the present invention, there is provided an illuminating device including the light-emitting element according to the first aspect.

According to a thirty-ninth aspect of the present invention, in the twenty-third aspect of the light-emitting element, the penetrating part reaches the second electrode layer.

Advantageous Effects of Invention

According to the first aspect of the present invention, it is possible to suppress reflection at the surface of the substrate when the light emitted from the light emitting sections is extracted from the transparent substrate side, and thus it is possible to provide a light-emitting element having a high light-emitting efficiency.

According to the second aspect of the present invention, it is possible to provide a light-emitting element having high brightness and a high light-emitting efficiency.

According to the third aspect of the present invention, the manufacture of the light-emitting element is facilitated.

According to the fourth to fourteenth aspects of the present invention, various kinds of light distribution can be obtained in comparison with a case where the present invention is not adopted.

According to the fourth aspect of the present invention, light emitted from the light emitting sections easily goes into the substrate side in comparison with a case where the present invention is not adopted.

According to the fifth aspect of the present invention, it is possible to suppress reflection of light at a portion formed into a tapered shape in comparison with a case where the present invention is not adopted.

By forming the bored parts into the shape other than the solid of revolution as described in the thirteenth to fifteenth aspects of the present invention, it is possible to make the light distribution to the plane parallel to the surface of the substrate anisotropic.

According to the sixteenth aspect of the present invention, it is possible to provide a light-emitting element having a high light-emitting efficiency.

According to the seventeenth aspect of the present invention, it is possible to provide a light-emitting element having a higher light-emitting efficiency.

According to the eighteenth aspect of the present invention, it is possible to increase brightness viewed from the front side of the substrate since the light component in the normal direction of the substrate is increased in comparison with a case where the present invention is not adopted.

According to the nineteenth to twenty-fifth aspects of the present invention, manufacture of the light-emitting element on which the light-emitting sections are distributed is facilitated.

According to the twenty-second aspect of the present invention, it is possible to provide a light-emitting element having high brightness and high color purity in comparison with a case where the present invention is not adopted.

According to the twenty-fourth aspect of the present invention, it is possible to provide a light-emitting element having a high light-emitting efficiency in comparison with a case where the present invention is not adopted.

According to any one of the twenty-sixth and twenty-seventh aspects of the present invention, it is possible to increase the emission intensity of the light-emitting element in comparison with a case where the present invention is not adopted.

According to the twenty-eighth aspect of the present invention, it is possible to satisfy improvement of the brightness and ease of the manufacture at the same time in comparison with a case where the present invention is not adopted.

According to the twenty-ninth aspect of the present invention, manufacture of the light-emitting element is facilitated in comparison with a case where the present invention is not adopted.

According to the thirtieth and thirty-first aspect of the present invention, by forming the penetrating parts into an anisotropic shape on the surface of the substrate, it is possible to make the light distribution to the plane parallel to the surface of the substrate anisotropic.

According to the thirty-second aspect of the present invention, the penetrating part and the bored part are easily manufactured at the same time.

According to the thirty-third aspect of the present invention, a wider selection of the material used for the electrodes is achieved in comparison with a case where the present invention is not adopted.

According to the thirty-fourth aspect of the present invention, it is possible to form the bored part easier in comparison with a case where the present invention is not adopted.

According to the thirty-fifth aspect of the present invention, it is possible to manufacture the light-emitting element with easier processes in comparison with a case where the present invention is not adopted.

According to the thirty-sixth aspect of the present invention, it is possible to control the shape of the bored parts easier in comparison with a case where the present invention is not adopted.

According to the thirty-seventh aspect of the present invention, it is possible to provide an image display device with high resolution and excellent durability in comparison with a case where the present invention is not adopted.

According to the thirty-eighth aspect of the present invention, it is possible to provide an illuminating device with high brightness and excellent durability in comparison with a case where the present invention is not adopted.

BRIEF DESCRIPTION OF DRAWINGS

FIG. 2A to 2C are diagrams for illustrating a path of light emitted from the light emitting section in cases of providing the bored part and not providing the bored part;

DESCRIPTION OF EMBODIMENTS

Hereinafter, the present invention will be described in detail.
(Light Emitting Element)

In a light emitting element of the present invention, light emitting sections are distributed on a transparent substrate, and one surface of the substrate on the light emitting section side is recessed to form bored parts below the light emitting sections. The number of the formed light emitting sections per 1 mm$^2$ of the surface of the substrate is preferably more than $10^2$, and more preferably in a range of $10^4$ to $10^8$. If the density of the light emitting sections is too low, brightness is difficult to be obtained. On the other hand, if the density thereof is too high, a light-emitting efficiency is decreased since the light emitting sections are overlapped and unable to be distributed.

In the present invention, "the light emitting sections" are regions where light is actually emitted at least. The regions may be a layered configuration (the layer is referred to as a "light-emitting layer"). Further, there may be a layer for transporting electric charges between each electrode and the light-emitting layer. Each of "the light emitting sections" includes a part (a part for transporting electric charges responsible for the light emission) between each electrode of the layers and the region where the light is emitted. In other words, the light emitting sections may be a layered configuration including a one or more layers. For example, the light emitting sections include a light-emitting layer and one or two existing layers selected from an electric charge injecting layer, an electric charge transfer layer and an electric charge blocking layer.

The bored part is preferably formed so as to be located below each of the light emitting sections. By this configuration, the bored part and a penetrating part for forming each of the light-emitting sections are formed at once, which is advantageous in manufacturing.

Hereinafter, an electroluminescence element is shown as an example of the light emitting element of the present invention, and a detailed description will be given for the exemplary embodiment of the present invention with reference to the attached drawings.

Figure 1:
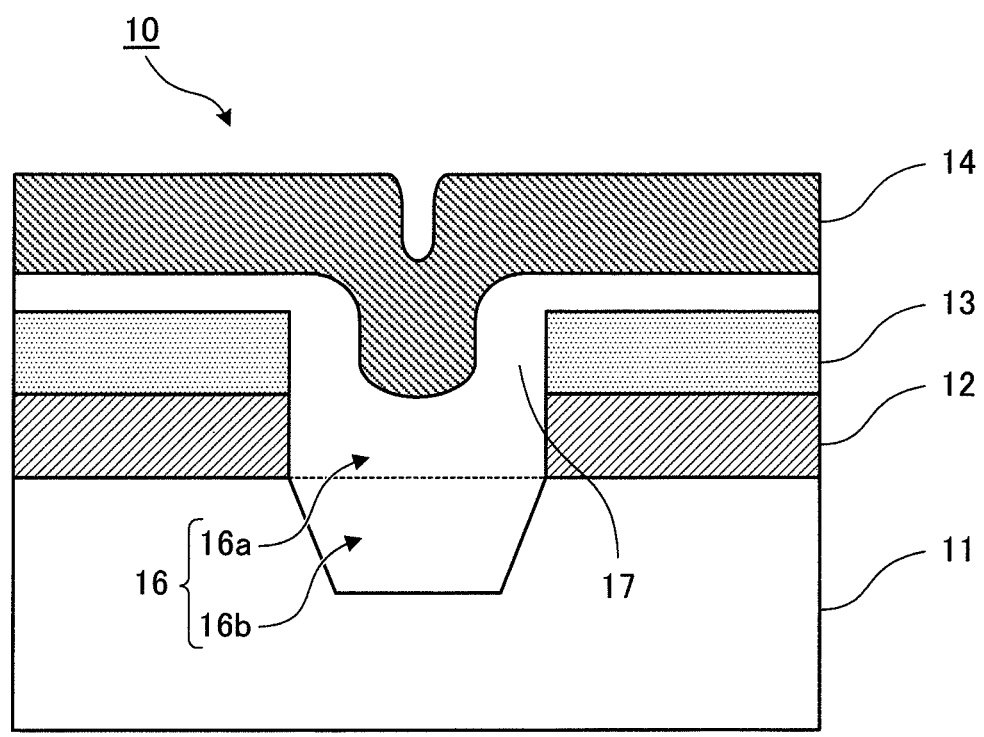
FIG. 1 is a partial cross-sectional view for illustrating one example of the electroluminescence element to which the exemplary embodiment is applied.

FIG. 1 is a partial cross-sectional view for illustrating one example of the electroluminescence element to which the exemplary embodiment is applied.

An electroluminescence element 10 shown in FIG. 1 has a configuration in which a substrate 11, an anode layer 12 as a first electrode layer for injecting holes formed on the substrate 11 in a case where the substrate 11 side is set to be the downside, a dielectric layer 13 formed on the first electrode layer, and a cathode layer 14 as a second electrode layer for injecting electrons which is formed so as to face the anode layer 12 via the dielectric layer 13 are stacked in this order. Further, the electroluminescence element 10 includes: a recessed part 16 including a penetrating part 16a formed by penetrating the anode layer 12 and the dielectric layer 13, and a bored part 16b formed in the substrate 11; and a light emitting section 17 which is formed so as to be in contact with the inner surface of the recessed part 16 and made of a light-emitting material emitting light with application of voltage.

Note that, the recessed part 16 is a part including the penetrating part 16a and the bored part 16b. The recessed part 16 may be formed of one bored part 16b and multiple penetrating parts 16a, or multiple bored parts 16b and one penetrating part 16a. However, the recessed part 16 is preferably formed of one bored part 16b and one penetrating part 16a since the manufacturing is facilitated.

In the electroluminescence element 10 shown in FIG. 1, the light emitting section 17 is formed to spread on not only the inside of the recessed part 16 but also the upper surface of the dielectric layer 13. The cathode layer 14 is formed over the light emitting section 17, and laminated as a so-called uniform film. Note that, in general, in a case of providing the dielectric layer 13, the current efficiency of the electroluminescence element is improved. However, if the current is sufficiently provided to the light emitting section 17 (does not short out), the dielectric layer 13 is not always essential. For example, a configuration including, instead of the dielectric layer 13, a layer made of a material having a resistivity equal to or more than the aforementioned light-emitting material may be accepted. The material having the resistivity equal to or more than the aforementioned light-emitting material may be the aforementioned light-emitting material.

The substrate 11 is a base for forming the anode layer 12, the dielectric layer 13, the cathode layer 14 and the light emitting section 17. The substrate 11 is made of a material satisfying mechanical strength required for the electroluminescence element 10.

In the exemplary embodiment, light emitted at the light emitting section 17 is extracted from the substrate 11 side. Thus, the substrate 11 is a transparent substrate. For the material of the substrate 11, it is necessary to be transparent for the visible light, in general. Note that, in the exemplary embodiment, "transparent for the visible light" indicates that the visible light having the wavelength of light emitted from the light emitting section 17 is transmissive. Thus, it is not necessary to be transparent for the entire region of the visible light. However, in the exemplary embodiment, light having wavelength within the range of 450 nm to 700 nm as the visible light may be transmissive. In addition, the light transmission is preferably not less than 50% for the visible light having the wavelength of 550 nm, and is more preferably not less than 70%.

Note that, in a case where the emitted light is not the visible light, the substrate 11 is necessary to be transparent for the region of the wavelength of the emitted light at least, as in the case of the visible light. The light transmission is preferably not less than 50% for the wavelength at the maximum intensity of the emitted light, and is more preferably not less than 70%.

Specific examples of the material satisfying such requirement for the transparent substrate include: glass such as sapphire glass, lime-soda glass, and quartz glass; transparent resins such as acrylic resins, methacrylic resins, polycarbonate resins, polyester resins and nylon resins; silicon; and transparent metallic oxide such as aluminum nitride and alumina. In a case of using, as the substrate 11, a resin film or the like made of the aforementioned transparent resins, permeability to gas such as moisture and oxygen may be low. In a case of using a resin film or the like having high permeability to gas, a thin film having a barrier property for inhibiting permeation of gas may be formed as long as the light transmission is not lost. In a case of using etching for forming the bored part 16b in the substrate 11, glass may be used as the substrate 11 in the light of dimensional stability, although detailed description thereof will be given later.

Although the thickness of the substrate 11 depends on the required mechanical strength, it is preferably 0.01 mm to 10 mm, and more preferably 0.05 mm to 2 mm. Further, refractive index of the substrate 11 may be lower than that of the light-emitting material for the light emitting section 17. In other words, in a case where the refractive index of the substrate 11 is higher than that of the light-emitting material for the light emitting section 17, total reflection is likely to occur when light enters from the light emitting section 17 to the substrate 11, and consequently the amount of the extracted light from the substrate 11 tends to decrease. Although the material for the light emitting section 17 will be also described later, most of the materials have the refractive index of about 1.5 to 1.9. Therefore, the refractive index of the substrate 11 may be lower than the above value.

Voltage is applied between the anode layer 12 and the cathode layer 14, and holes are injected from the anode layer 12 to the light emitting section 17. A material used for the anode layer 12 is necessary to have electric conductivity. Specifically, it has a low work function, and the work function is preferably not more than −4.5 eV. In addition, the electric resistance may not be notably changed for an alkaline aqueous solution.

As the material satisfying such requirements, metal oxides, metals or alloys are used. As the metal oxides, indium tin oxide (ITO) and indium zinc oxide (IZO) are provided, for example. As metals, provided are: copper (Cu); silver (Ag); gold (Au); platinum (Pt); tungsten (W); titanium (Ti); tantalum (Ta); niobium (Nb) and the like. Further, alloys such as stainless steel including these metals are used. As described above, the material usable for the anode layer 12 is not only the transparent material but also an opaque material. In other words, in the exemplary embodiment, since the anode layer 12 is penetrated by the penetrating part 16a, the light emitted from the light emitting section 17 goes through the penetrating part 16a and the bored part 16b, and then the light is extracted from the substrate 11 side. The thickness of the anode layer 12 is formed to be, for example, 2 nm to 2 mm, and to be preferably 2 nm to 2 µm. Note that, the work function can be measured by, for example, an ultraviolet photoelectron spectroscopy.

The dielectric layer 13 is provided between the anode layer 12 and the cathode layer 14, and separates the anode layer 12 from the cathode layer 14 at a predetermined distance to isolate the anode layer 12 and the cathode layer 14, so that voltage is applied to the light emitting section 17. Thus, the dielectric layer 13 is necessary to be made of a material having high resistivity. The electric resistivity thereof is required to be not less than $10^8$ Ωcm, and preferably not less than $10^{12}$ Ωcm. Specific examples of the material include: metal nitrides such as silicon nitride, boron nitride and aluminum nitride; and metal oxides such as silicon oxide (silicon dioxide) and aluminum oxide; and in addition, polymer compound such as polyimide, polyvinylidene fluoride and parylene may be used. The thickness of the dielectric layer 13 may be not more than 1 µm in order to suppress the entire thickness of the electroluminescence element 10. In addition, since the voltage necessary to emit light is lower as the distance between the anode layer 12 and the cathode layer 14 is shorter, the dielectric layer 13 may be thin from this viewpoint. However, if it is too thin, dielectric strength becomes possibly insufficient against the voltage for driving the electroluminescence element 10. Here, the dielectric strength is preferably not more than 0.1 mA/cm$^2$ in current density passing between the anode layer 12 and the cathode layer 14 in the state where the light emitting section 17 is not formed, and more preferably not more than 0.01 mA/cm$^2$. Further, since the dielectric layer 13 may endure the voltage more than 2V higher than the driving voltage of the electroluminescence element 10, the aforementioned current density is necessary to be achieved in a case of, for example, the driving voltage of 5V, when the voltage of about 7V is applied between the anode layer 12 and the cathode layer 14 in the state where the light emitting section 17 is not formed. The thickness of the dielectric layer 13 that satisfies these requirements is preferably 10 nm to 500 nm, and more preferably 50 nm to 200 nm.

The cathode layer 14 injects electrons into the light emitting section 17 upon application of voltage between the anode layer 12 and the cathode layer 14. In the exemplary embodiment, since the recessed part 16 is filled with the light emitting section 17 as described below, the cathode layer 14 is formed over the dielectric layer 13 like a so-called uniform film. In other words, it does not have any hole portion penetrated by the recessed part 16, and is formed as a continuous film not penetrated by the recessed part 16.

The material used for the cathode layer 14 is not particularly limited as long as, similar to that of the anode layer 12, the material has electrical conductivity; however, the material may have a low work function and be chemically stable. In view of the chemical stability, it is preferable to use materials having a work function of not more than −2.9 eV. The specific examples of the material include Al, MgAg alloy and alloys of Al and alkali metals such as AlLi and AlCa. The thickness of the cathode layer 14 is preferably 10 nm to 1 µm, and more preferably 50 nm to 500 nm. In a case of the electroluminescence element 10 of the exemplary embodiment, light emitted from the light emitting section 17 is extracted from the substrate 11 side. Therefore, the cathode layer 14 may be formed by an opaque material. Note that, if light is intended to be extracted from not only the substrate 11 side but also the cathode layer 14 side by using the configuration of the cathode layer 14 as an uniform film covering the light emitting section 17 as shown in the exemplary embodiment, the cathode layer 14 is necessary to be made of a transparent material such as ITO (Indium Tin Oxide).

To lower the barrier for the electron injection from the cathode layer 14 into the light emitting section 17 and thereby to increase the electron injection efficiency, a cathode buffer layer that is not shown may be provided adjacent to the cathode layer 14. The cathode buffer layer is required to have a lower work function than the cathode layer 14, and metallic materials may be used therefor. For example, the material thereof includes alkali metals (Na, K, Rb and Cs), alkaline earth metals (Sr, Ba, Ca and Mg), rare earth metals (Pr, Sm, Eu and Yb), one selected from fluoride, chloride and oxide of these metals and mixture of two or more selected therefrom. The thickness of the cathode buffer layer is preferably in the range of 0.05 nm to 50 nm, more preferably 0.1 nm to 20 nm, and still more preferably 0.5 nm to 10 nm.

The recessed part 16 is provided with the light emitting section 17 applied to the inside thereof, and is provided for extracting the light from the light emitting section 17. In the exemplary embodiment, the recessed part 16 includes the penetrating part 16a formed by penetrating the anode layer 12 and the dielectric layer 13, and the bored part 16b formed in the substrate 11. Note that, in FIG. 1, a border between the penetrating part 16a and the bored part 16b is shown with a dotted line. Further, in the exemplary embodiment, "the surface of the substrate" indicates a surface configured by a boundary surface between the substrate 11 and the anode layer 12 and a boundary surface between the penetrating part 16a and the bored part 16b in FIG. 1. By providing the recessed part 16 as described above, the light emitted from the light emitting section 17 at the penetrating part 16a is transmitted from the penetrating part 16a to the bored part 16b in the recessed part 16. The light is further transmitted in the substrate 11 therefrom, and thereby the light is extracted from the substrate 11 side. Here, since the penetrating part 16a is formed so as to penetrate the anode layer 12 and the dielectric layer 13, it is possible to extract the light even when the anode layer 12 serving as the first electrode layer is made of an opaque material.

Here, the shape of the penetrating part 16a is, for example, a cylinder-like shape, a cuboid-like shape (trench shape) or the like. However, the shape thereof is not limited to the above. The maximum width of the penetrating part 16a is preferably in the rage of 0.01 µm to 10 µm, and more preferably 0.01 µm to 5 µm and still more preferably 0.01 µm to 1 µm. Note that, the maximum width of the penetrating part 16a is referred to as a diameter of a maximum circle included in the shape of the penetrating part 16a at the surface (the surface of the substrate) where the penetrating part 16a is in contact with the bored part 16b.

In the exemplary embodiment, if the shape of the penetrating part 16a is set to be a cuboid, a light distribution to a plane parallel to the substrate surface becomes anisotropic. Further, in a case where the penetrating parts 16a have a cuboid-like shape having planes nearly parallel to each other, that is, where one penetrating part 16a is aligned with the other penetrating parts on the surface of the substrate 11 so that the long sides thereof are approximately in parallel to each other, the light distribution having more anistropic is easily obtained.

If the distance between the light emitting sections distributed on the substrate 11 is set to be small, an emission intensity of the electroluminescence element is set to be large since the number of the light emitting sections 17 per unit area is increased. For example, in the electroluminescence element 10 of the exemplary embodiment, in a case where light is emitted with high intensity at the penetrating part 16a, if the distance between the penetrating parts 16a is set to be small, the emission intensity is set to be large since the number of the penetrating parts 16a per unit area is increased.

Further, in the electroluminescence element 10 of the exemplary embodiment, the light emitting section 17 tends to emit light in the vicinity of the anode layer 12 and the cathode layer 14. In other words, the central part of the penetrating part 16a is likely to be a non light-emitting area, and if the non light-emitting area is large, the electroluminescence element 10 is difficult to emit light with high brightness. Therefore, if the width (W) of the penetrating part 16a is set to be small, the emission intensity is easy to be set large since the non light-emitting area at the central part of the recessed part 16 is decreased. Specifically, the penetrating part 16a preferably has a width (W) not more than 10 µm. Note that, the width of the penetrating part 16a indicates the distance (shortest distance) from one end of the penetrating part 16a to the other end on the shorter axis. In addition, the distance (shortest distance) between the adjacent penetrating parts 16a on the shorter axis may be short for the same reason.

Further, in the exemplary embodiment, by providing the bored part 16b, light extraction efficiency is increased.

The bored part 16b is provided on the surface of the substrate 11 below the light emitting section 17. One bored part 16b may be provided below the plural light emitting sections 17, or plural bored parts 16b may be provided below one light emitting section 17. However, one bored part 16b is generally provided below one light emitting section 17, since the light extraction efficiency is easy to be increased. Note that, the maximum width of the bored part 16b is referred to as the diameter of the maximum circle included in the shape of the bored part 16b at the surface of the substrate 11.

The shape of the bored part 16b may be, for example, a cylinder-like shape or a cuboid-like shape, although it is not limited to the above. Note that, by setting the shape of the bored part 16b as a shape other than a solid of revolution, the light distribution to a plane parallel to the surface of the substrate 11 is made to be anisotropic. The maximum width of the bored part 16b (the diameter in a case of setting the bored part 16b as a cylinder-like shape) is preferably in the range of 0.01 µm to 10 µm, and more preferably 0.01 µm to 5 µm, and still more preferably 0.01 µm to 2 µm. Note that, within the above-mentioned range, if the upper limit of the maximum width of the bored part 16b is set at the value lower than 1 µm, the emission efficiency is more increased.

In the exemplary embodiment, by setting the shape of the bored part 16b as a cuboid, the light distribution to a plane parallel to the surface of the substrate is made to be anisotropic. Alternatively, in a case of setting the shape of the bored parts 16b as a cuboid-like shape approximately parallel to each other, that is, in a case where one bored part 16b is aligned with the other bored parts on the surface of the substrate 11 so that the long sides are approximately parallel to each other, the light distribution having more anistropic is easily obtained.

FIG. 2A to 2C are diagrams for illustrating a path of light emitted from the light emitting section 17 in cases of providing the bored part 16b and not providing the bored part 16b.

FIG. 2A is a diagram for illustrating a path of light in the electroluminescence element 10 of the exemplary embodiment, in which the recessed part 16 is formed by providing the bored part 16b together with the penetrating part 16a. In contrast, FIG. 2C is a diagram for illustrating a path of light in the electroluminescence element in which the recessed part 16 is formed by providing the penetrating part 16a without the bored part 16b.

In the case where the bored part 16b is not provided as shown in FIG. 2C, light emitted from the light emitting section 17 and going toward the substrate 11 enters the inside of the substrate 11 while being refracted if the direction of the light has an angle with the surface of the substrate 11 higher than a predetermined angle, and thus the light is extracted from the substrate 11 side. However, if the direction of the light has an angle with the surface of the substrate 11 lower than the predetermined angle, total reflection occurs, and thus the light is unable to enter the inside of the substrate 11. In other words, the totally-reflected light is not extracted from the substrate 11 side, and the outcoupling efficiency is decreased by loss of light.

On the other hand, in the case where the bored part 16b is provided as shown in FIG. 2A, light emitted from the light emitting section 17 and going toward the substrate 11 tends to reach the sidewall or the bottom face of the bored part 16b at an angle higher than the aforementioned predetermined angle. Thus, the rate of light entering the inside of the substrate 11 is higher than that in the case of FIG. 2C. In other words, the rate of the totally reflected light is decreased, and the amount of light extracted from the substrate 11 side is increased. As a result, the outcoupling efficiency is improved.

As shown in FIG. 2B, light reflected at the bottom face of the bottom of the bored part 16b also enters the inside of the substrate 11 from the sidewall of the bored part 16b. Further, the light is reflected at the anode layer 12 and thus it is extracted from the substrate 11 side. In this case, the anode layer 12 may be made of a metal or an alloy from the standpoint of ease of reflection.

In the electroluminescence element 10 of the exemplary embodiment in which the recessed part 16 is formed by providing the bored part 16b together with the penetrating part 16a, light-emitting efficiency is improved, and thus power consumption is easy to be lowered. Further, by lowering the power consumption, durability of the electroluminescence element 10 is easily improved.

Note that, the cross-sectional shape of the bored part 16b shown in FIG. 1 is a trapezoid having a width that becomes narrower in a direction toward the bottom thereof. In other words, an area from the surface of the substrate 11 to the bottom of the recessed part 16 as a deepest part has a tapered shape, and the deepest part of the bored part 16b is a flat surface. By providing such a tapered shape, when light enters the substrate 11, the light easily has an angle larger than the aforementioned predetermined angle at the sidewall of the bored part 16b, and thus the light emitted from the light emitting section 17 is easier to enter the substrate 11 side. In addition, by adopting this shape, light enters the substrate 11 at an angle closer to a normal direction of the substrate 11. Further, by setting the refractive index of the substrate 11 lower than the refractive index of the light emitting section 17, light is refracted and enters the substrate 11 at an angle closer to the normal direction of the substrate 11 by lens effect.

As described above, when light further goes out from the substrate 11, brightness viewed from the front side of the substrate is increased by forming the cross-sectional shape of the bored part 16b as a tapered shape, with increasing amount of light. In this case, in order to obtain such a light distribution easily, the tapered shape may have a width that becomes continuously narrower. In other words, since light is easily reflected as described above with a stepped shape included in the tapered shape, the tapered shape that becomes continuously narrower may be adopted.

However, it is not essential that the cross-sectional shape of the bored part 16b is set as the tapered shape, depending on the desired light distribution. The shape of the bored part 16b for obtaining various kinds of light distribution properties is exemplified in FIG. 3 to FIG. 10 described below.

Figure 3:
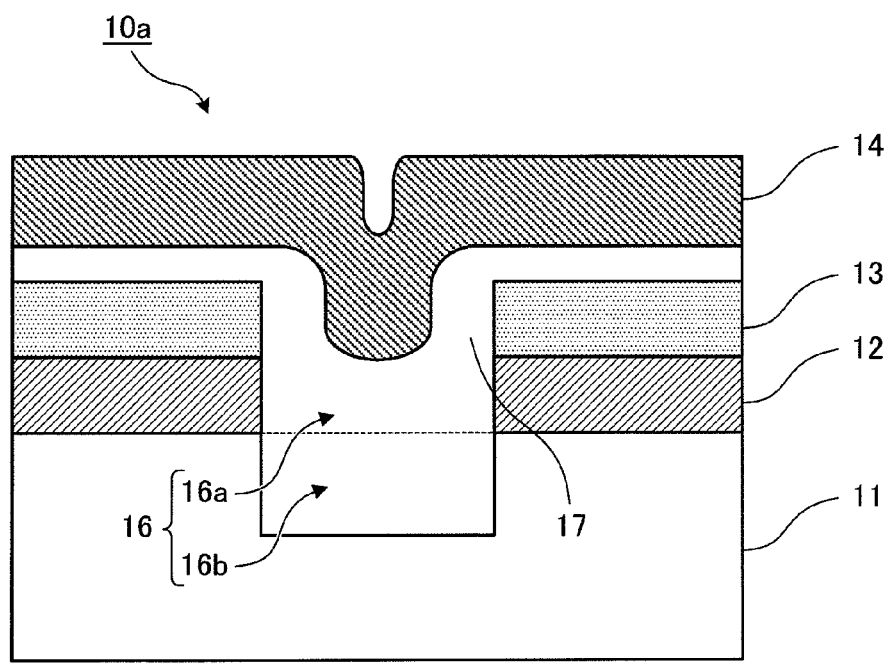
FIG. 3 is a diagram for illustrating one example in a case of forming the bored part that is not the tapered shape in the electroluminescence element to which the exemplary embodiment is applied.

FIG. 3 is a diagram for illustrating one example in a case of forming the bored part 16b that is not the tapered shape.

An electroluminescence element 10a shown in FIG. 3 is an example in which the cross-sectional shape of the bored part 16b is set as a rectangle. That is, the bored part 16b has approximately the same width from the surface of the substrate 11 to the deepest part of the bored part 16b. Even when the bored part 16b is formed as described above, the rate of light entering the inside of the substrate 11 is more increased than in the case of not providing the aforementioned bored part 16b as shown in FIG. 2C, and thus the outcoupling efficiency is improved.

Figure 4:
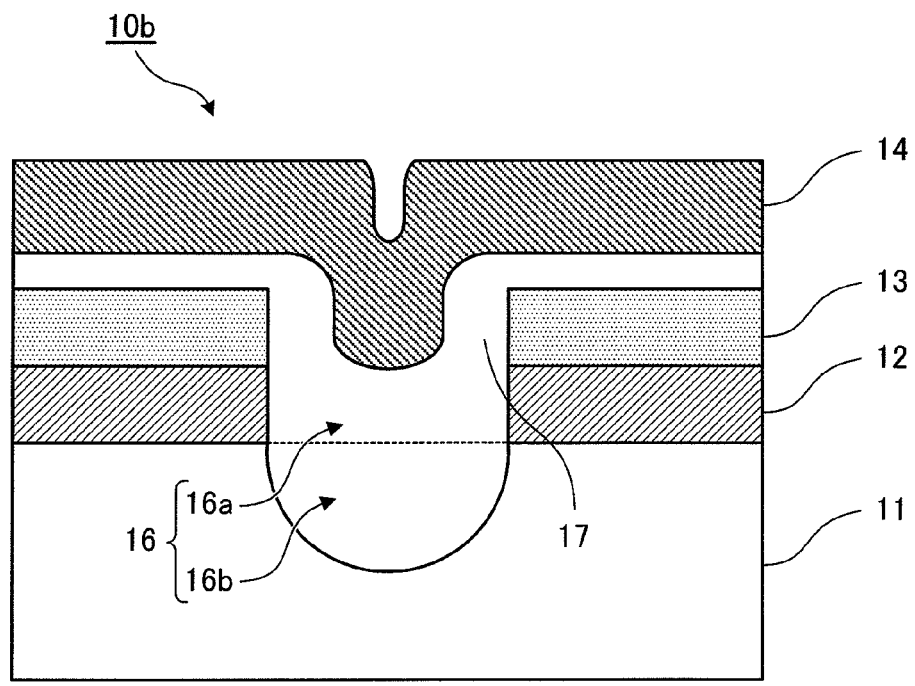
FIG. 4 is another example in which the cross-sectional shape of the bored part is set as a semicircle in the electroluminescence element to which the exemplary embodiment is applied.

An electroluminescence element 10b shown in FIG. 4 is another example in which the cross-sectional shape of the bored part 16b is set as a semicircle. In the electroluminescence element 10b, an area of the bored part 16b from the surface of the substrate 11 to the bottom as the deepest part of the recessed part 16 has a tapered shape, and the shape is formed to be a semicircle. Compared to the aforementioned electroluminescence element 10 having the cross-sectional shape of the bored part 16b as a trapezoid and the electroluminescence element 10a having the cross-sectional shape of the bored part 16b as a rectangle, the rate of light reflected at the bottom surface is decreased since the bottom face does not exist at the bottom of the bored part 16b.

Figure 5:
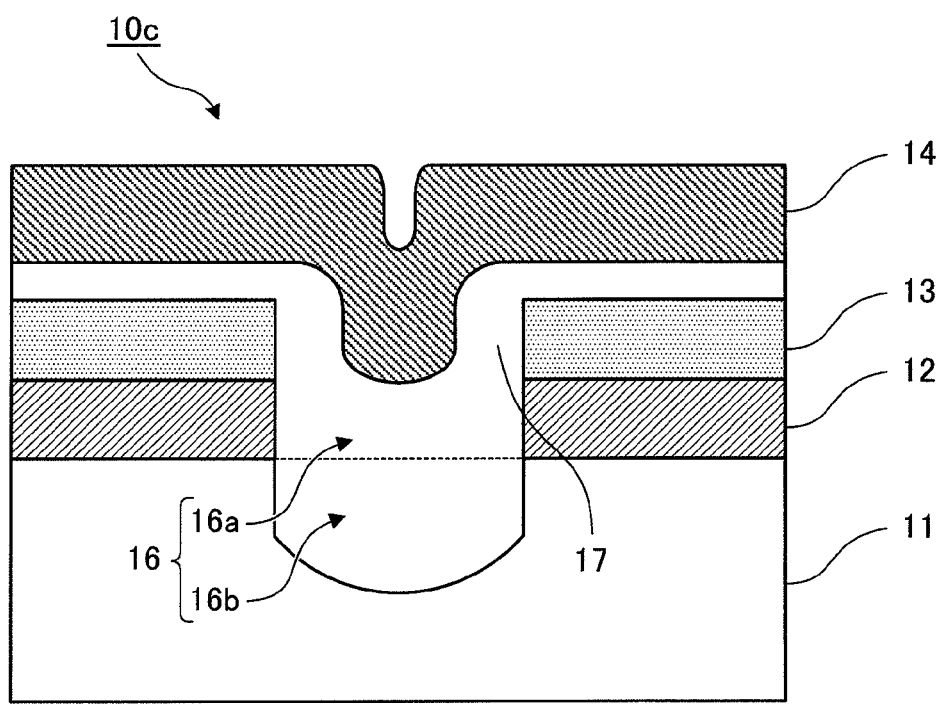
FIG. 5 is a further example of providing a tapered shape at one part of the area from the surface of the substrate to the bottom as the deepest part of the recessed part in the electroluminescence element to which the exemplary embodiment is applied.

An electroluminescence element 10c shown in FIG. 5 is a further example of providing a tapered shape at one part of the area from the surface of the substrate 11 to the bottom as the deepest part of the recessed part 16. In the electroluminescence element 10c, the shape forming an arc is adopted as a tapered shape. In this case, the deepest part of the bored part 16b has a curve surface.

Figure 6:
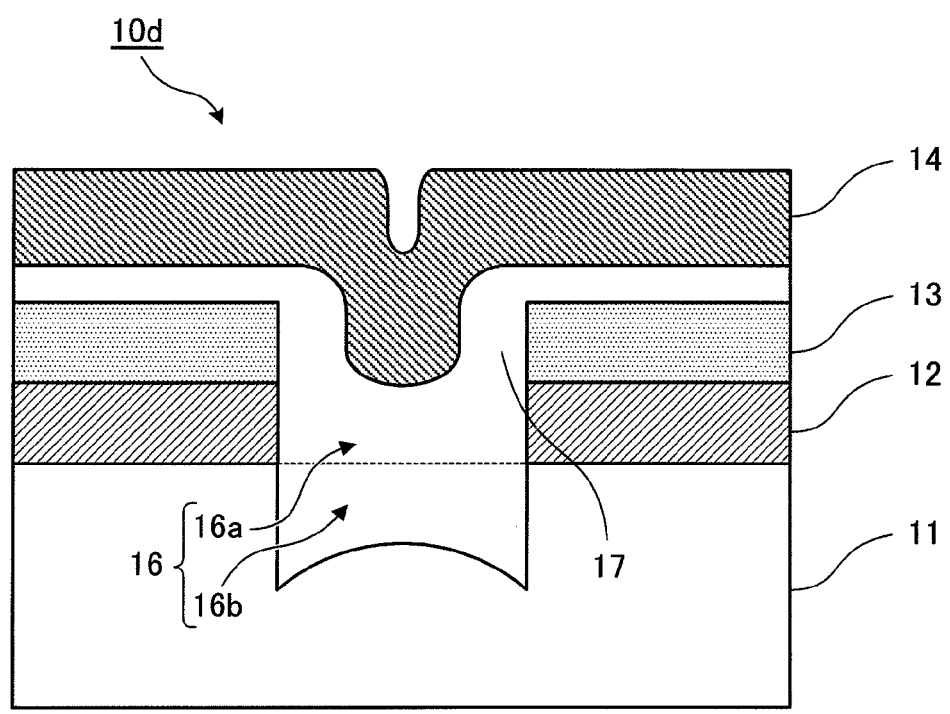
FIG. 6 is a still further example of forming the bottom part of the bored part as a convex shape in the electroluminescence element illustrated in FIG. 3.

An electroluminescence element 10d shown in FIG. 6 is a still further example of forming the bottom part of the bored part 16b as a convex shape in the electroluminescence element 10a illustrated in FIG. 3. That is, the bored part 16b has a convex bottom. In this case, even when light is reflected at the bottom part of the bored part 16b, the amount of light entering the sidewall part of the bored part 16b is more increased than in a case of the electroluminescence element 10a. Thus, light is reflected again at the anode layer 12 and then is extracted from the substrate 11 side as described in FIG. 2B.

Figure 7:
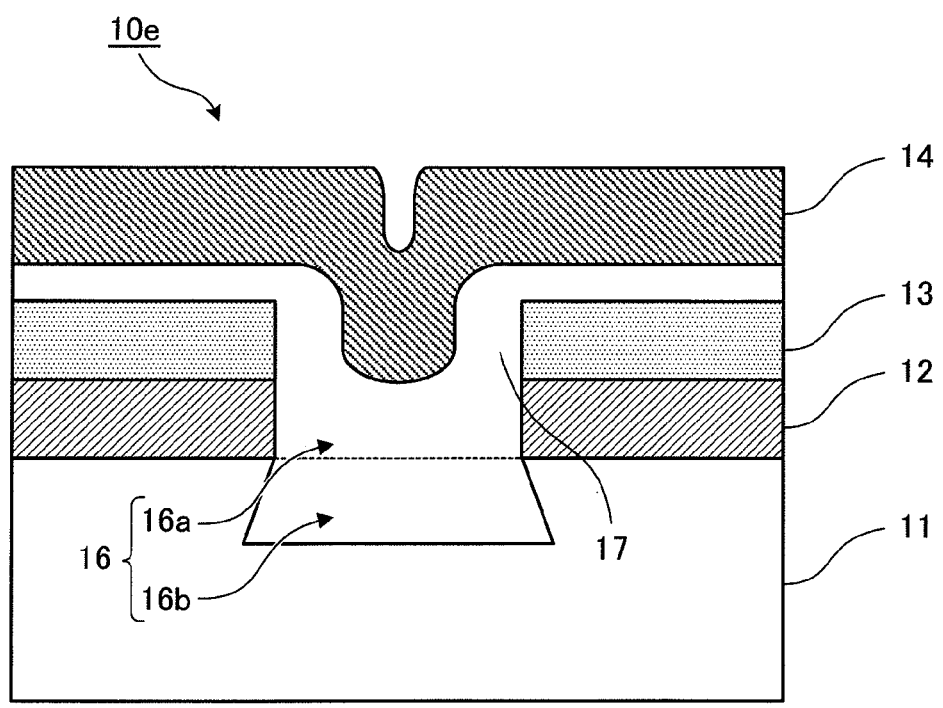
FIG. 7 illustrates a case of forming the cross-sectional shape of the bored part as a flare shape that becomes wider from the surface of the substrate to the bottom as the deepest part of the recessed part in the electroluminescence element to which the exemplary embodiment is applied.

An electroluminescence element 10e shown in FIG. 7 illustrates a case of forming the cross-sectional shape of the bored part 16b as a flare shape that becomes wider from the surface of the substrate 11 to the bottom as the deepest part of the recessed part 16. That is, the bored part 16b has a tapered shape, and this tapered shape is continuously widened.

Even when the bored part 16b is formed as described above, the rate of light entering the inside of the substrate 11 is more increased than in the aforementioned case of not providing the bored part 16b as shown in FIG. 2C, and thus the outcoupling efficiency is improved.

Figure 8:
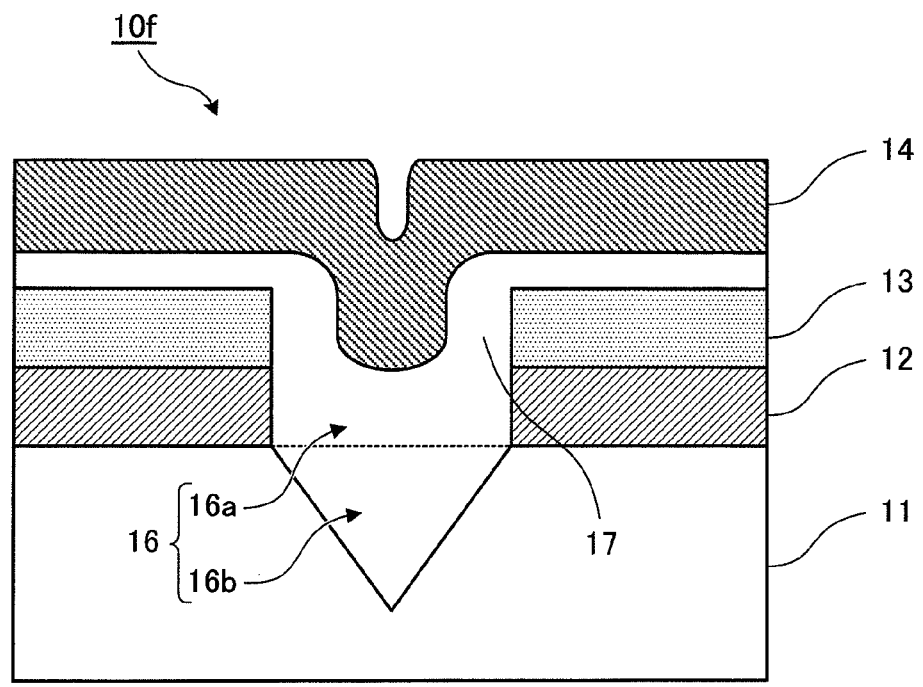
FIG. 8 illustrates a case in which the cross-sectional shape of the bored part is formed as a triangle in the electroluminescence element to which the exemplary embodiment is applied.

An electroluminescence element 10f shown in FIG. 8 illustrates a case in which the cross-sectional shape of the bored part 16b is formed as a triangle so that the width thereof is smaller in a direction toward the bottom. That is, the deepest part of the bored part 16b has a pointed shape end. Also in this case, the rate of light reflected at the bottom is decreased since the bottom surface does not exist at the bottom of the bored part 16b.

Figure 9:
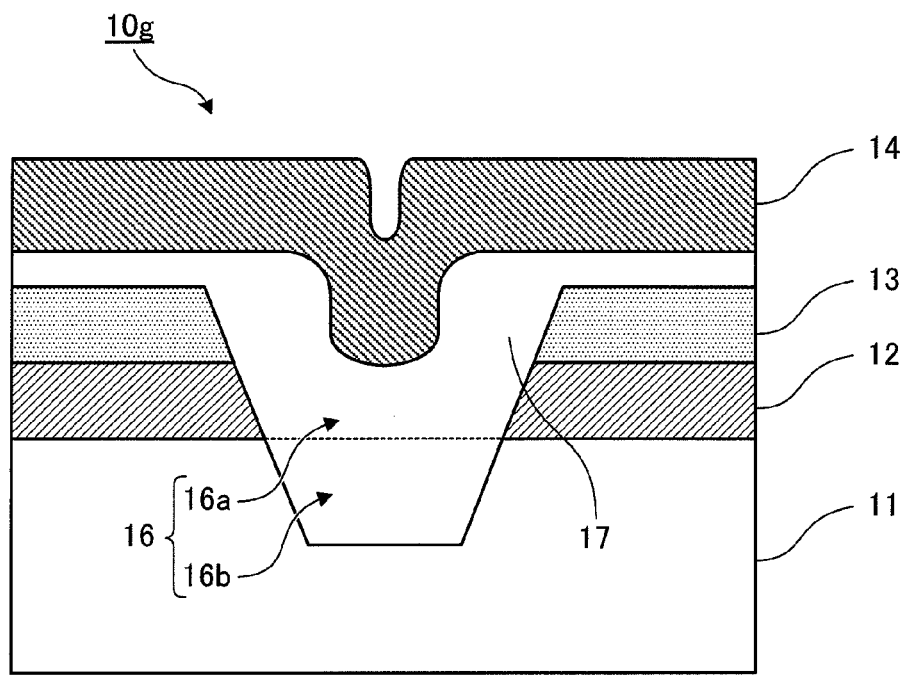
FIG. 9 is an example in which the shape of the penetrating part in the anode layer and the dielectric layer is changed so as to correspond to a slope of the sidewall of the bored part in the electroluminescence element to which the exemplary embodiment is applied.

An electroluminescence element 10g shown in FIG. 9 is an example in which the shape of the penetrating part 16a in the anode layer 12 and the dielectric layer 13 is changed so as to correspond to a slope of the sidewall of the bored part 16b. Note that, in this example, although the penetrating part 16a and the bored part 16b are formed so that the cross-sectional shape of the sidewall is continuous and linear, the penetrating part 16a and the bored part 16b may be formed so that the cross-sectional shape thereof is curved.

Note that, in the aforementioned examples, the width of the penetrating part 16a and the width of the bored part 16b are approximately coincide with each other, that is, the width of the penetrating part 16a and the width of the bored part 16b are approximately the same. In other words, the bored part 16b is formed so that the width of the bored part 16b corresponds to the width of the penetrating part 16a. That is to say, the sidewall from the penetrating part 16a to the bored part 16b is formed as a continuous surface. However, such a configuration is not always necessary, and the width of the bored part 16b at the surface of the substrate 11 may be wider than the width of the penetrating part 16a.

Figure 10:
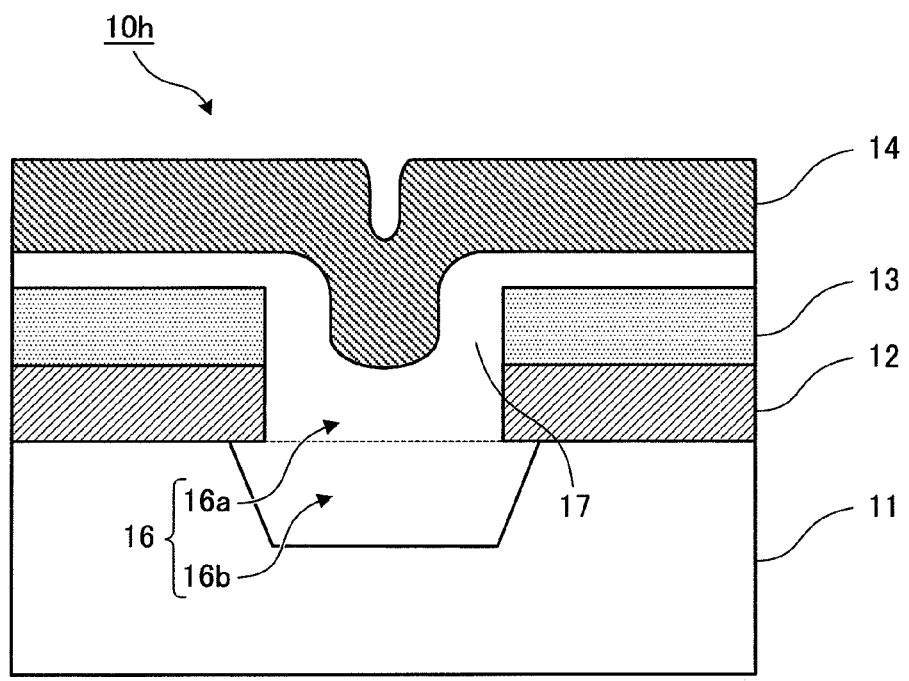
FIG. 10 is a diagram for illustrating an example of a case in which the width of the bored part at the surface of the substrate is wider than the width of the penetrating part in the electroluminescence element to which the exemplary embodiment is applied.

FIG. 10 is a diagram for illustrating an example of a case in which the width of the bored part 16b at the surface of the substrate 11 is wider than the width of the penetrating part 16a.

When an electroluminescence element 10h shown in FIG. 10 is compared with the electroluminescence element 10 shown in FIG. 1, they are the same in that the cross-sectional shape of the bored part 16b is a trapezoid having a width smaller in a direction toward the bottom. On the other hand, in the electroluminescence element 10h, the width of the bored part 16b at the surface of the substrate 11 is wider than the width of the penetrating part 16a.

Even when the bored part 16b is formed as described above, the rate of light entering the inside of the substrate 11 is more increased than in the aforementioned case where the bored part 16b is not provided as shown in FIG. 2C, and thus the outcoupling efficiency is improved.

In the present invention, the light emitting section 17 is made of a light-emitting material that emits light by application of voltage and current supply, and is formed by applying the material so as to be in contact with an inner surface of the recessed part 16 including at least the inner surface of the penetrating part 16a. In the light emitting section 17, holes injected from the anode layer 12 and the electrons (holes) injected from the cathode layer 14 are recombined, and light emission occurs. In the exemplary embodiment, in order to simplify the manufacturing process, the recessed part 16 is filled with the material of the light emitting section 17, as mentioned above.

As the material of the light emitting section 17, either an organic material or an inorganic material may be used. In this case, the electroluminescence element using an organic material is served as an organic electroluminescence element.

In a case where an organic material is used as the light-emitting material, either low-molecular compound or high-molecular compound may be used. Examples may include light-emitting low-molecular compound and light-emitting high-molecular compound described in Oyo Butsuri (Applied Physics), Yutaka Ohmori, Vol. 70, No. 12, pages 1419-1425 (2001).

However, in the exemplary embodiment, a material may have an excellent coating property. In other words, in the structure of the electroluminescence element in the exemplary embodiment, for stable light emission of the light emitting section 17 at least in the inner surface of the penetrating part 16a, and preferably in the penetrating part 16, the light emitting section 17 may be uniformly in contact with the inner surface of the recessed part 16 to be formed in a uniform thickness, that is, a coverage property thereof may be improved. If the light emitting section 17 is formed without using a material having an excellent coating property, the light emitting section 17 is not uniformly in contact with the recessed part 16, or the inner surface of the recessed part 16 tend to be formed in a non-uniform thickness. Thereby, unevenness of brightness of light output from the recessed part 16 is easily caused.

Further, in order to form the light emitting section 17 uniformly in the recessed part 16, a coating method may be adopted. In other words, in the coating method, since it is easy to fill light-emitting material solution including a light-emitting material in the recessed part 16, formation with high coverage property is enabled even on a surface having a recessed part or a convex part. In the coating method, materials having mainly a weight average molecular weight of 1,000 to 2,000,000 are preferably used to improve the coating property. Moreover, to improve the coating property, it is possible to add additives for improving the coating property such as a leveling agent and a defoaming agent, or to add a binder resin having low charge trapping capability.

Specifically, examples of material having an excellent coating property include: arylamine compound having a predetermined structure with a molecular weight of 1,500 or more to 6,000 or less disclosed in Japanese Patent Application Laid Open Publication No. 2007-86639; and a predetermined high molecular phosphor disclosed in Japanese Patent Application Laid Open Publication No. 2000-34476.

Among the materials having the excellent coating property, a light-emitting high-molecular compound may be preferable in terms of simplification of manufacturing process of the electroluminescence element 10, and a phosphorescent light-emitting compound may be preferable in terms of high light-emitting efficiency. Accordingly, a phosphorescent light-emitting high-molecular compound is particularly preferable. Note that, it is possible to mix plural materials or to add a low molecular light-emitting material (for example, molecular weight of not more than 1000) within a scope which does not impair the coating property. On this occasion, an amount of adding the low molecular light-emitting material is preferably not more than 30 wt %.

Further, the light-emitting high-molecular compound may be classified into a conjugated light-emitting high-molecular compound and a non-conjugated light-emitting high-molecular compound; however, among these, the non-conjugated light-emitting high-molecular compound may be preferable.

From the aforementioned reasons, as the light-emitting material used in the exemplary embodiment, a phosphorescent light-emitting non-conjugated high-molecular compound (a light-emitting material which is a phosphorescent light-emitting polymer and also a non-conjugated light-emitting high-molecular compound) is especially preferable.

The light emitting section 17 of the electroluminescence element 10 according to the present invention may include at least the phosphorescent light-emitting polymer (phosphorescent light-emitting material) in which one molecule contains a phosphorescent light-emitting unit that emits phosphorescent light and a carrier transporting unit that transports a carrier. The phosphorescent light-emitting polymer is obtained by copolymerizing a phosphorescent light-emitting compound having a polymerizing substituent and a carrier-transporting compound having a polymerizing substituent. The phosphorescent light-emitting compound is a metal complex containing a metallic element selected from iridium (Ir), platinum (Pt) and gold (Au), and especially, an iridium complex is preferable.

Examples of phosphorescent light-emitting compound having a polymerizing substituent are compounds shown in the subsequence formulas (E-1) to (E-49) in which one or more hydrogen atoms in a metal complex are substituted by polymerizing substituents.

[Chemical structural formulas 1]

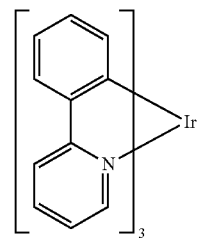

E-1

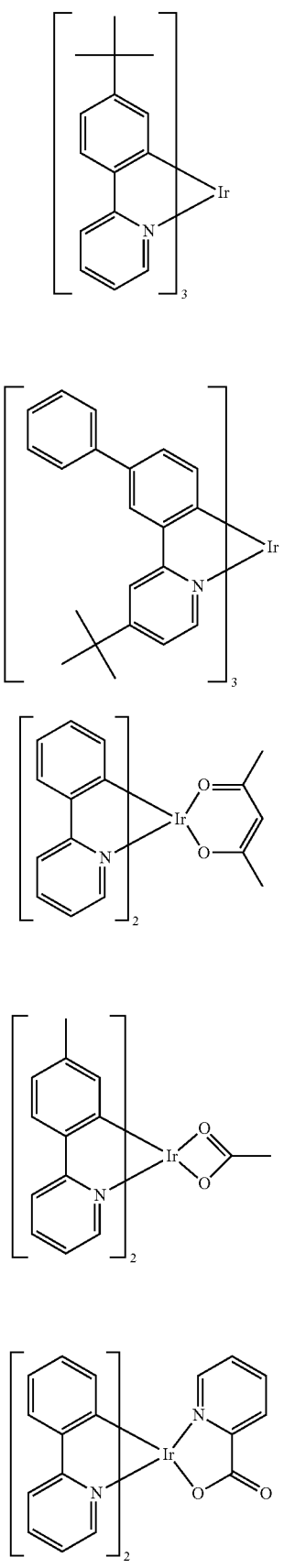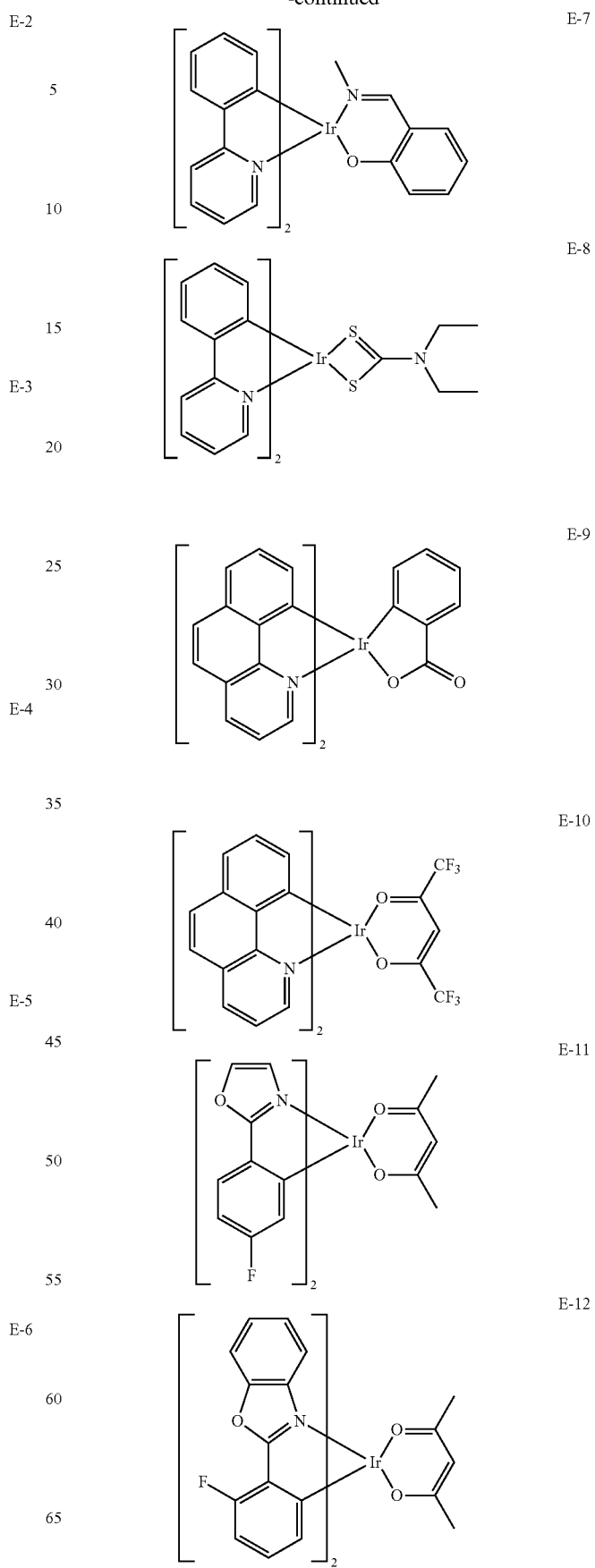

[Chemical structural formulas 2]
E-13
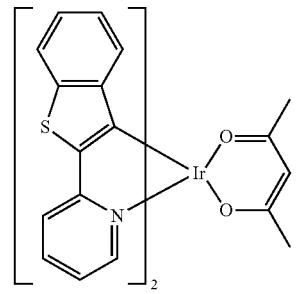
E-14
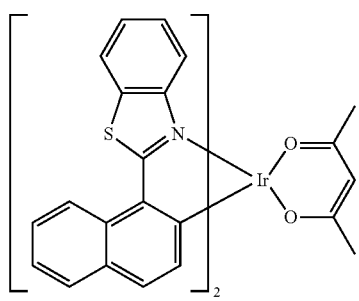
E-15
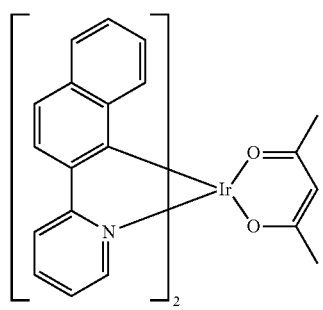
E-16
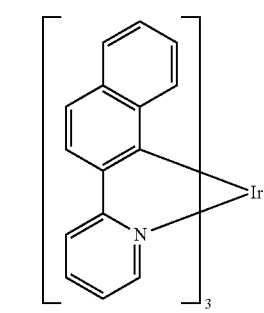
E-17
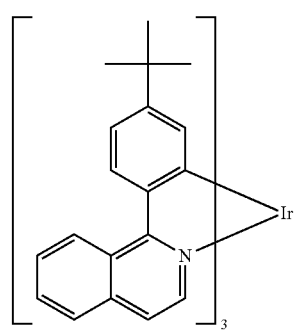
E-18
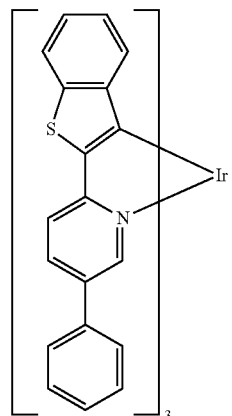
E-19
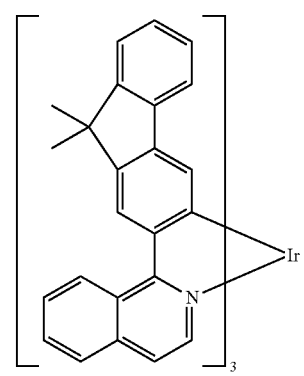
E-20
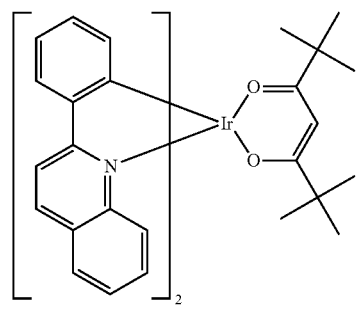
[Chemical structural formulas 3]
E-21
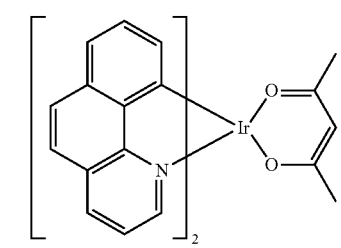
E-22
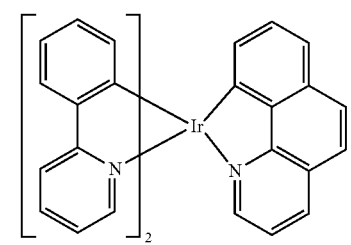

E-23
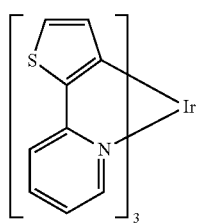
E-24
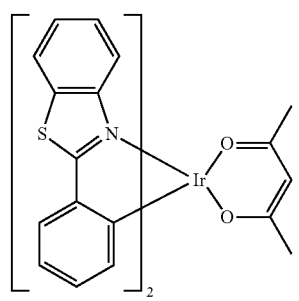
E-25
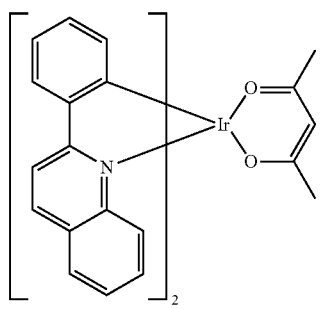
E-26
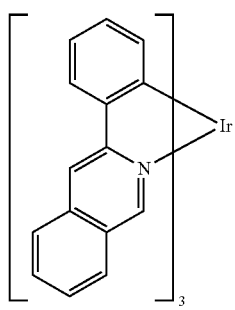
E-27
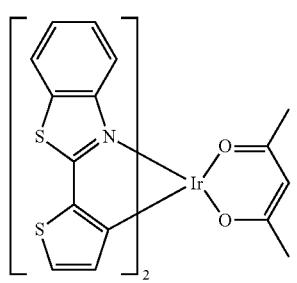
E-28
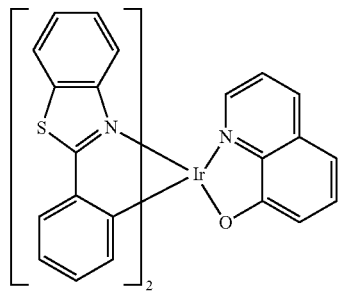
E-29
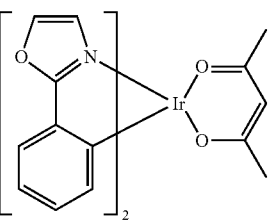
E-30
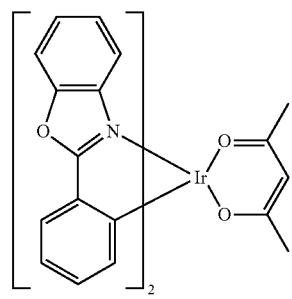
E-31
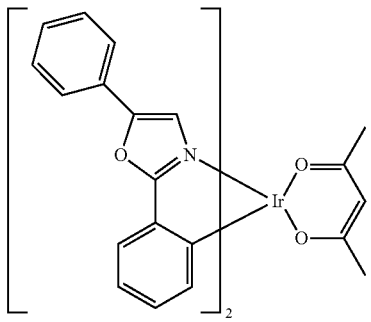
E-32
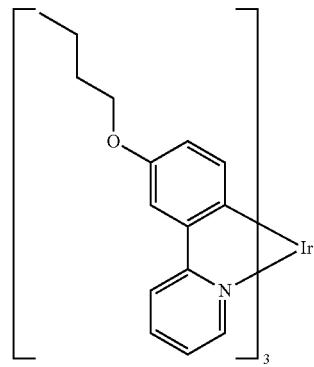

[Chemical structural formulas 4]
E-33
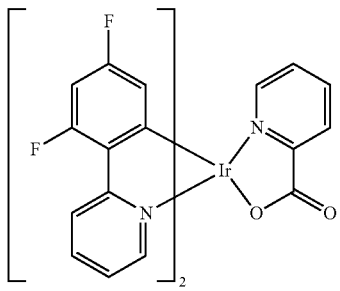
E-34
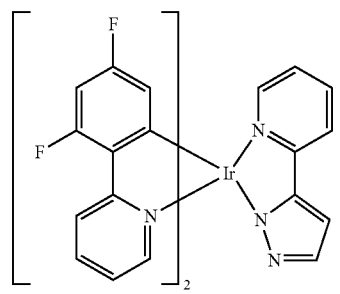
E-35
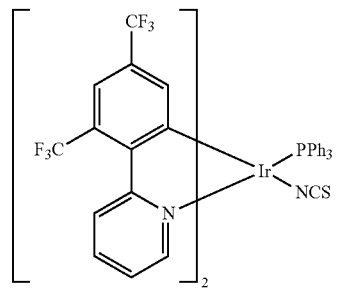
E-36
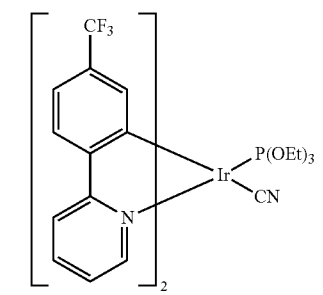
E-37
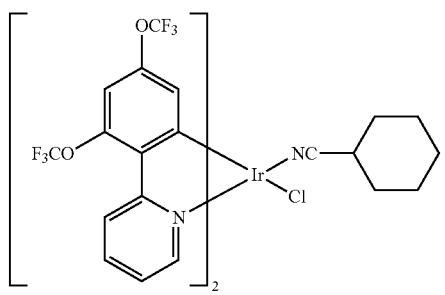
E-38
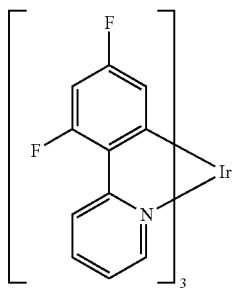
E-39
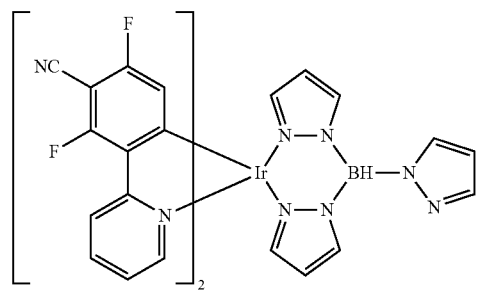
[Chemical structural formulas 5]
E-40
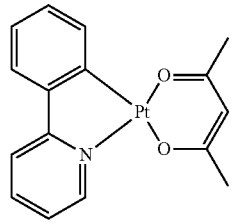
E-41
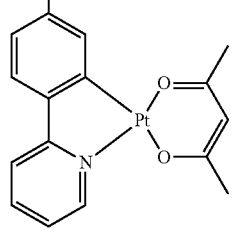
E-42
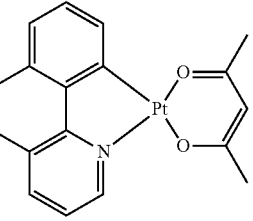
E-43
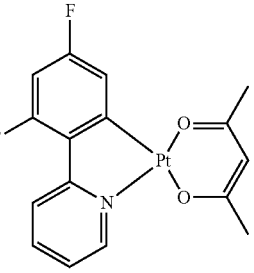

25

-continued

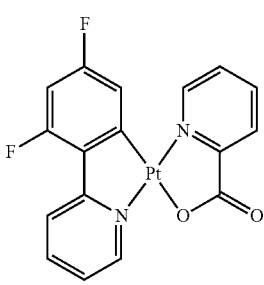
E-44

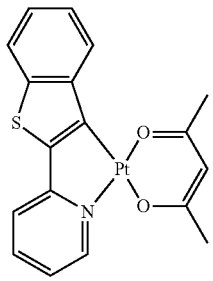
E-45

[Chemical structural formulas 6]

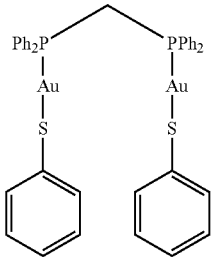
E-46

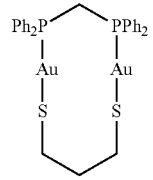
E-47

Ph₃P—Au—≡—⟨phenyl⟩
E-48

Ph₃P—Au—(≡)₄—Au—PPh₃
E-49

Note that, in the above formulas (E-35), (E-46) to (E-49), Ph denotes a phenyl group.

Examples of the polymerizing substituent in the phosphorescent light-emitting compound include a vinyl group, an acrylate group, a methacrylate group, an urethane (meth)acrylate group such as a methacryloyl oxyethyl carbamate group, a styryl group and a derivative thereof, and a vinyl amide group and a derivative thereof. Among these, a vinyl group, a methacrylate group, and a styryl group and a derivative thereof are particularly preferable. These substituents may bind to a metal complex via an organic group that has 1 to 20 carbons and may have a hetero atom.

Examples of the carrier-transporting compound having a polymerizing substituent include a compound in which one or more hydrogen atoms in an organic compound having any

26 one or both of a hole-transporting property and an electron-transporting property are substituted by polymerizing substituents.

Representative examples of such a compound include compounds shown in the subsequent formulas (E-50) to (E-67).

[Chemical structural formulas 7]

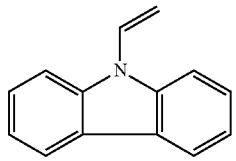
E-50

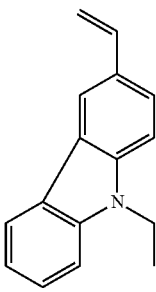
E-51

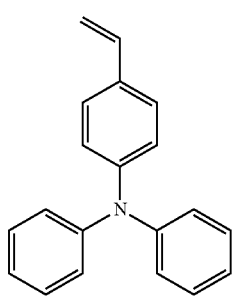
E-52

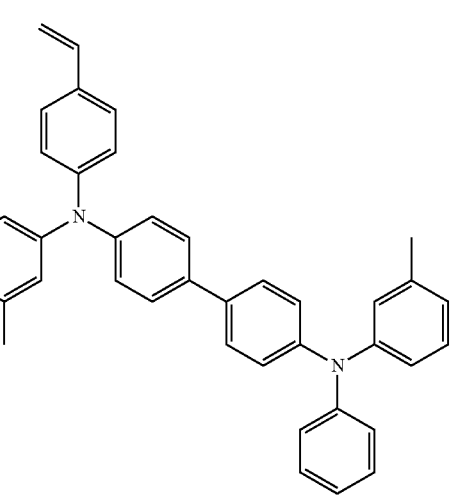
E-53

E-54
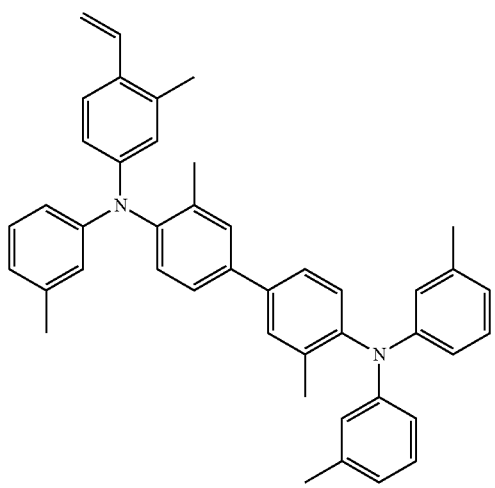
E-57
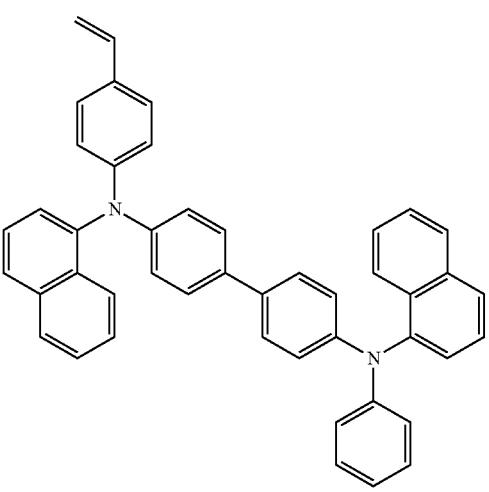
E-55
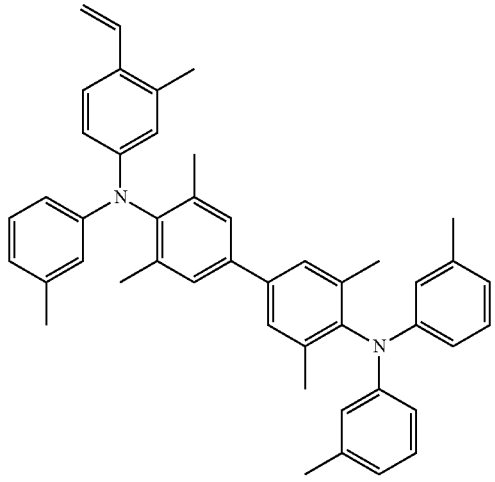
E-58
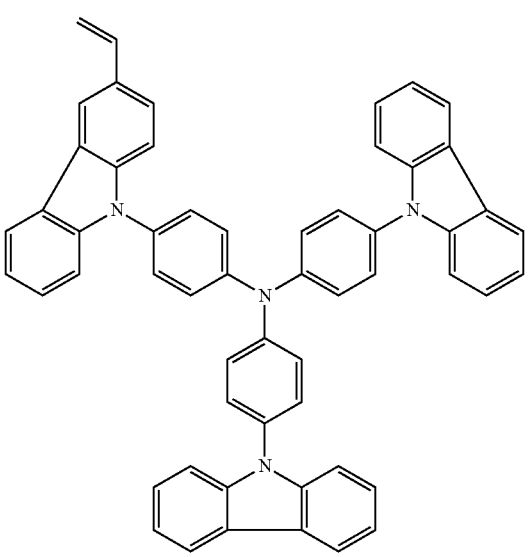
[Chemical structural formulas 8]
E-56
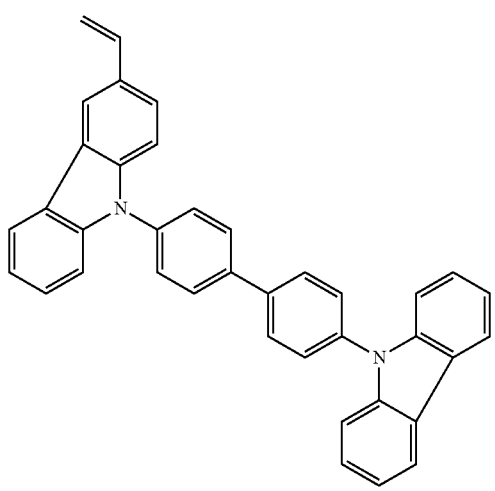
E-59
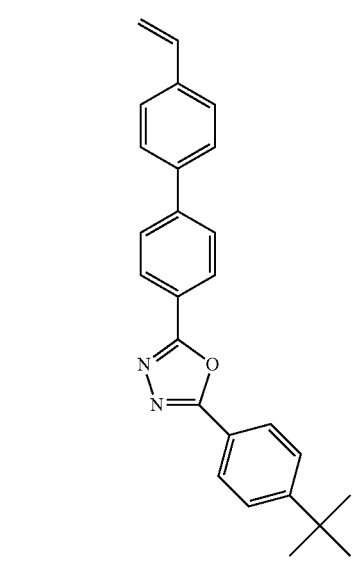

E-60
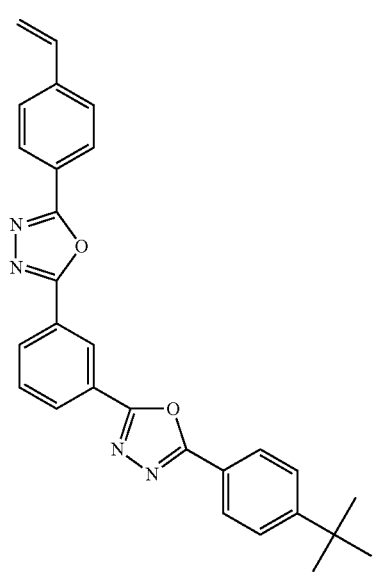
E-61
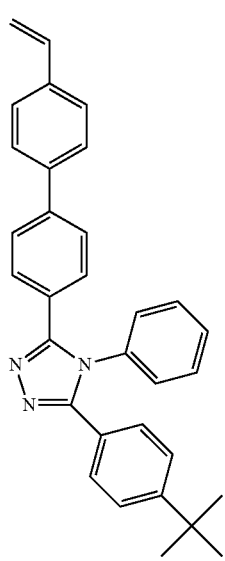
E-62
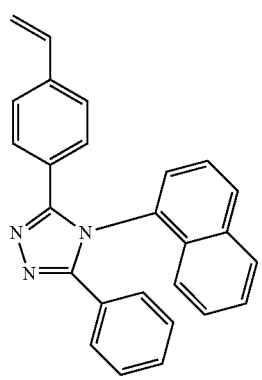
E-63
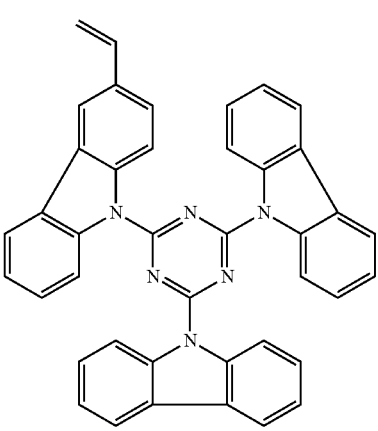
E-64
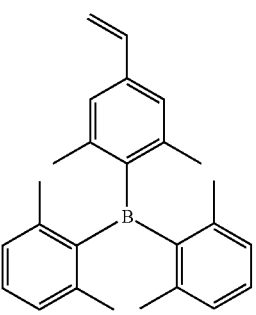
E-65
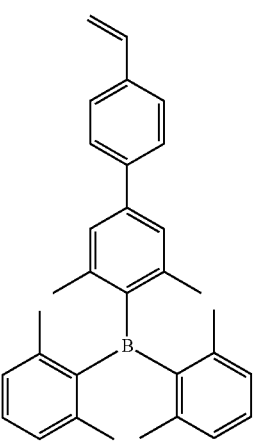

E-66

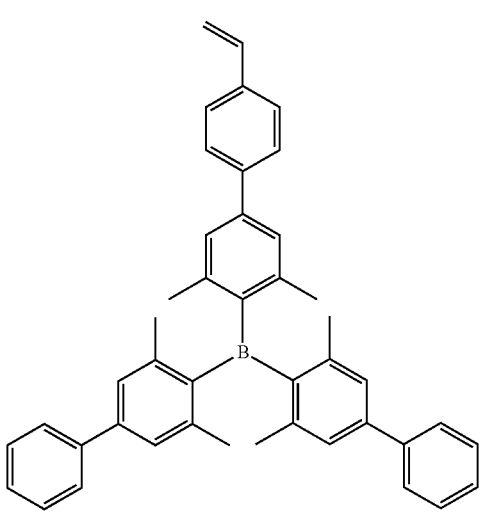

E-67

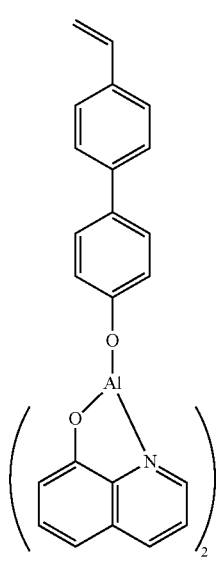

Although the polymerizing substituent in the carrier-transporting compounds shown as the examples is a vinyl group, compounds in which the vinyl group is substituted by another polymerizing substituent such as an acrylate group, a methacrylate group, an urethane(meth)acrylate group such as a methacryloyl oxyethyl carbamate group, a styryl group and a derivative thereof, and an vinyl amide group and a derivative thereof may be accepted. Further, these polymerizing substituents may bind thereto via an organic group that has 1 to 20 carbons and may have a hetero atom.

As a polymerization procedure for polymerizing a phosphorescent light-emitting compound having a polymerizing substituent and a carrier-transporting compound having a polymerizing substituent, any of a radical polymerization, a cationic polymerization, an anionic polymerization, or an addition polymerization is acceptable. However, a radical polymerization is preferable. A molecular weight of the polymer is preferably, as a weight-average molecular weight, 1,000 to 2,000,000, and more preferably 5,000 to 1,000,000. The molecular weight herein is a polystyrene equivalent molecular weight measured by a gel permeation chromatography (GPC).

The phosphorescent light-emitting polymer may be made by copolymerizing a phosphorescent light-emitting compound and a carrier-transporting compound, or a phosphorescent light-emitting compound and two or more kinds of carrier-transporting compounds. Alternatively, it may be made by copolymerizing two or more kinds of phosphorescent light-emitting compounds and a carrier-transporting compound.

As a monomer sequence of the phosphorescent light-emitting polymer, any of a random copolymer, a block copolymer, and an alternate copolymer is acceptable. If the number of repeating units of a structure of the phosphorescent light-emitting compound is denoted by m, and the number of repeating units of a structure of the carrier-transporting compound is denoted by n (m and n are integers not less than 1), a proportion of the number of the repeating units of the structure of the phosphorescent light-emitting compound to the total number of the repeating units, that is, the value of $m/(m+n)$ is preferably in a range of 0.001 to 0.5, and more preferably in a range of 0.001 to 0.2.

More specific examples and synthesis methods of the phosphorescent light-emitting polymer are disclosed in, for example, Japanese Patent Application Laid Open Publications No. 2003-342325, No. 2003-119179, No. 2003-113246, No. 2003-206320, No. 2003-147021, No. 2003-171391, No. 2004-346312, and No. 2005-97589.

The light emitting section 17 of the electroluminescence element 10 according to the exemplary embodiment may include the aforementioned phosphorescent light-emitting compound, and may include a hole-transporting compound or an electron-transporting compound in order to supplement carrier-transporting property of the light emitting section 17. Examples of the hole-transporting compound used for this purpose include low molecular triphenylamine derivatives such as: TPD (N,N'-diphenyl-N,N'-bis(3-methylphenyl)-1, 1'-biphenyl-4,4' diamine); α-NPD (4,4'-bis[N-(1-naphthyl)-N-phenylamino] biphenyl; and m-MTDATA (4,4',4"-tris(3-methylphenylphenylamino)triphenylamine. In addition, examples also include: polyvinylcarbazole; triphenylamine derivative-based high-molecular compound polymerized by introducing a polymerizable functional group; a polymer compound having a triphenylamine skeleton disclosed in Japanese Patent Application Laid Open Publication No. 8-157575; polyparaphenylenevinylene; and polydialkylfluorene. Further, examples of the electron-transporting compound include low molecular materials such as: a quinolinol derivative metal complex, for example, trisquinolinolato aluminum (Alq3); an oxadiazole derivative; a triazole derivative; an imidazole derivative; a triazine derivative; and a triarylborane derivative. The examples further include known electron-transporting compounds such as the aforementioned low-molecular electron-transporting compound polymerized by introducing the polymerizable functional group, for instance, polyPBD disclosed in Japanese Patent Application Laid Open Publication No. 10-1665.

Even in a case of using a light-emitting low-molecular compound instead of the aforementioned light-emitting polymer compound as a light-emitting material used for the light emitting section 17, a hole-transporting compound, an electron-transporting compound, or a laminated layer thereof is usable. Further, it is also possible to add the aforementioned light-emitting polymer compound as a light-emitting material.

Specific examples of the hole-transporting compounds in this case include TPD, α-NPD, m-MTDATA, phthalocyanine complex, DTDPFL, spiro-TPD, TPAC, PDA and the like disclosed in Japanese Patent Application Laid Open Publication No. 2006-76901.

In addition, examples include compounds shown in the following formulas (E-68) to (E-76).
[Chemical structural formula 9]
E-68
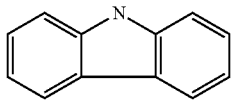
E-69
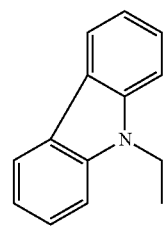
E-70
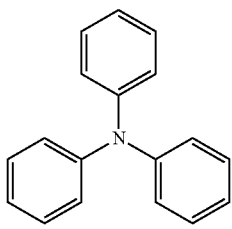
E-71
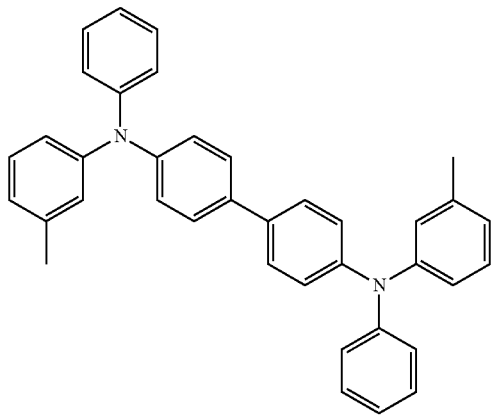
E-72
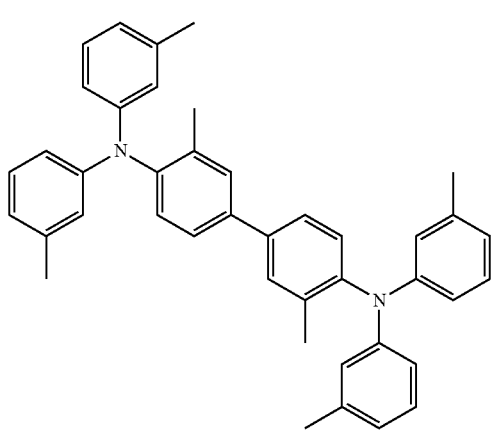
E-73
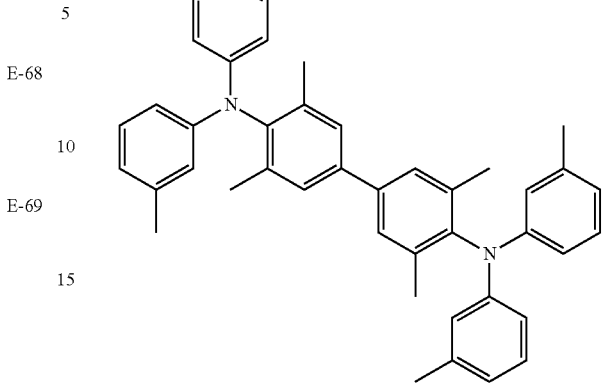
E-74
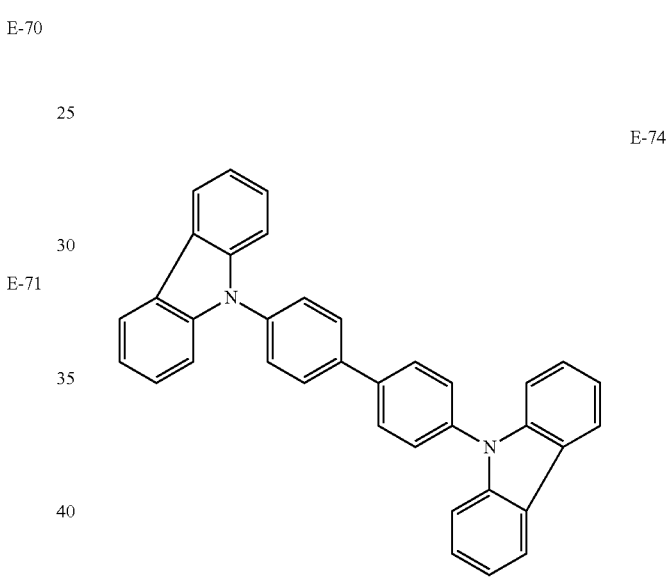
E-75
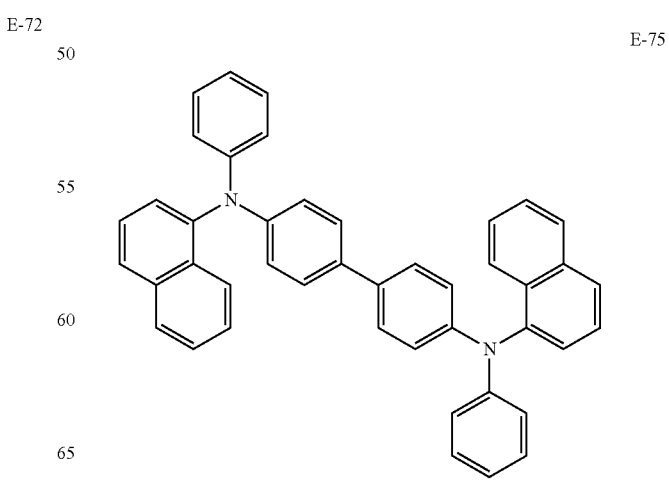

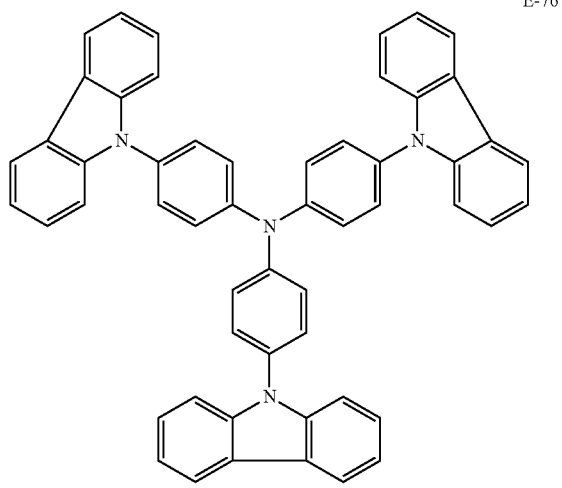
E-76
Specific examples of the electron-transporting compound in this case include, for example, BPhen, BCP, OXD-7 and TAZ disclosed in Japanese Patent Application Laid Open Publication No. 2006-76901. In addition, examples include compounds shown in the following formulas (E-77) to (E-85).
[Chemical structural formula 10]
E-77
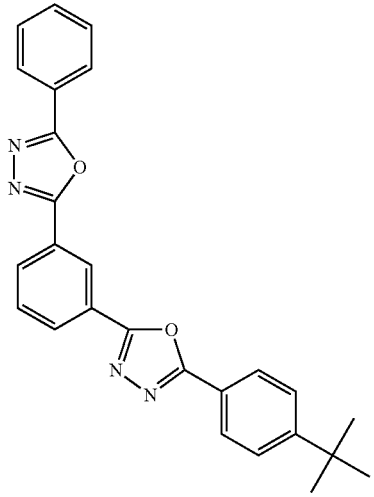
E-78
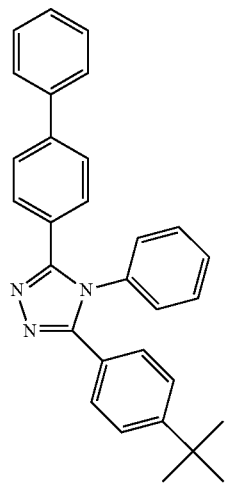
E-79
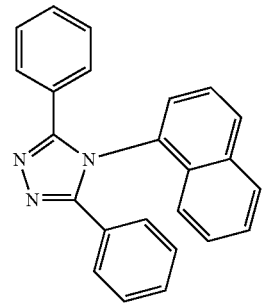
E-80
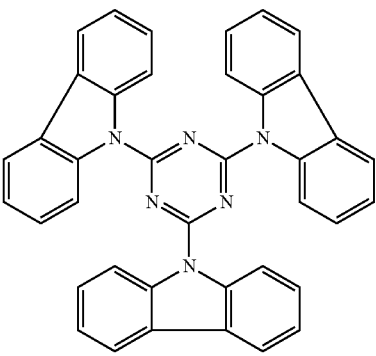
E-81

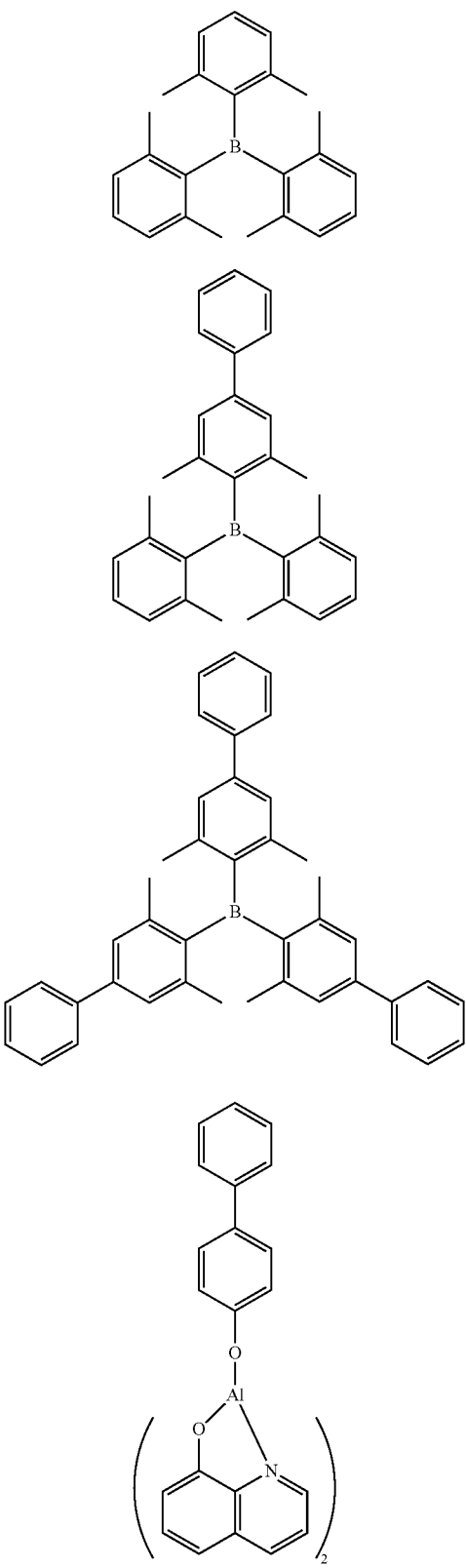

E-82

E-83

E-84

E-85

Further, for example, a compound having a bipolar molecular structure having the hole-transporting property and the electron-transporting property in one molecule, which is disclosed in Japanese Patent Application Laid Open Publication No. 2006-273792, is also usable.

In the electroluminescence element 10 in the exemplary embodiment, an inorganic material is usable for a light-emitting body as mentioned above. The electroluminescence element using an inorganic material is served as an inorganic electroluminescence element. As an inorganic material, for example, an inorganic phosphor may be used. Specific examples of this inorganic phosphor, a configuration of the electroluminescence element and a manufacturing method thereof are disclosed in Japanese Patent Application Laid Open Publication No. 2008-251531 as a known technique, for example.

The electroluminescence element 10 that has been described above in detail is not limited to the electroluminescence elements 10 and 10a to 10h shown in FIGS. 1 to 10 in which the light emitting section 17 spreads and is formed not only in the inside of the recessed part 16 but also on the upper surface of the dielectric layer 13.

Figure 11A:
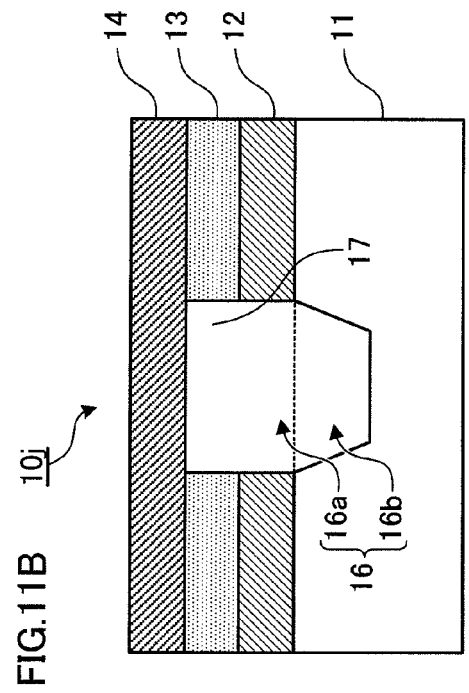
FIGS. 11A to 11C are cross-sectional views for illustrating other examples of the light emitting section 17 in the electroluminescence element to which the exemplary embodiment is applied.
Figure 11B:
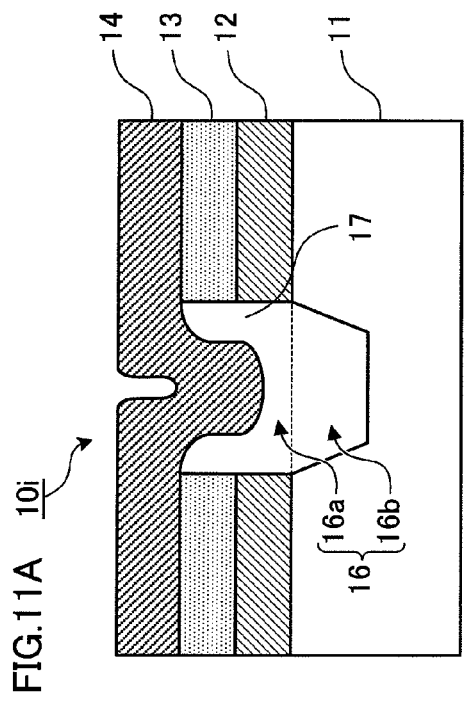
Figure 11C:
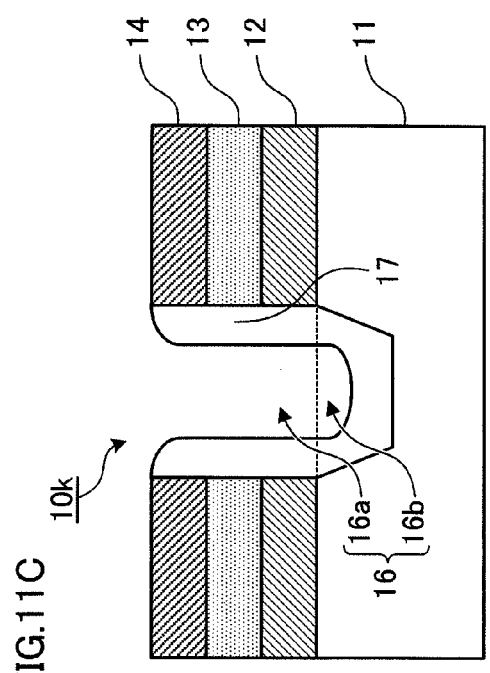

FIGS. 11A to 11C are cross-sectional views for illustrating other examples of the light emitting section 17 in the electroluminescence element 10 to which the exemplary embodiment is applied.

An electroluminescence element 10i in FIG. 11A shows a case where the light emitting section 17 is formed inside the recessed part 16 but the light-emitting layer is not formed on the upper surface of the dielectric layer 13. By using reflection at the surface of the cathode layer 14 protruding to the inside of the penetrating part 16a, light is more efficiently extracted.

Further, an electroluminescence element 10j in FIG. 11B shows a case where the light-emitting layer is formed so as to reach the upper surface of the dielectric layer 13, and all of the recessed part 16 is filled with a light-emitting material. By this configuration, the cathode layer 14 is formed in a planar state. By forming the cathode layer 14 in the planar state, a pinhole or a crack of the cathode layer 14 is inhibited, and thus the electroluminescence element having less unevenness of brightness is obtained.

Furthermore, an electroluminescence element 10k in FIG. 11C shows a case where the penetrating part 16a is provided also in the cathode layer 14, and the light emitting section 17 is formed so that the light-emitting layer is located along the inside of the recessed part 16. In this configuration, only part of the recessed part 16 is filled with the material of the light emitting section 17. Further, since the penetrating part 16a is formed also in the cathode layer 14, even if the cathode layer 14 is made of an opaque material, light is extracted not only from the substrate 11 side but also from the cathode layer 14 side, and thus the light is efficiently extracted.

Also in these electroluminescence elements 10i and 10k, parts of the light emitting section 17 where light is easily emitted are not changed, and therefore temporal change of the light-emitting efficiency or the like tends not to occur in comparison with the case of the electroluminescence elements 10 and 10a to 10h shown in FIGS. 1 to 10. Note that, although detailed description will be given in the manufacturing method of the electroluminescence element 10 later, manufacture of the electroluminescence elements 10 and 10a to 10h is easier.

Note that, in the electroluminescence elements 10 and 10a to 10l having been described above in detail, description has been given for a case where the anode layer 12 is formed on the lower side and the cathode layer 14 is formed on the upper side while the dielectric layer 13 is sandwiched therebetween so as to be opposed thereto if the substrate 11 side is set as a lower side, as an example. However, the structure is not limited to the above, and a structure in which the anode layer 12 and the cathode layer 14 are switched to each other may be accepted. In other words, a configuration where the cathode layer 14 is formed on the lower side and the anode layer 12 is formed on the upper side while the dielectric layer 13 is sandwiched therebetween so as to be opposed thereto if the substrate 11 side is set as a lower side is also accepted.

(Manufacturing Method of Electroluminescence Element)

Next, description will be given for a manufacturing method of the electroluminescence element to which the exemplary embodiment is applied while the electroluminescence element 10 described with FIG. 1 is taken as an example.

FIGS. 13A to 13H are diagrams for illustrating the manufacturing method of the electroluminescence element 10 to which the exemplary embodiment is applied.

Figure 13A:
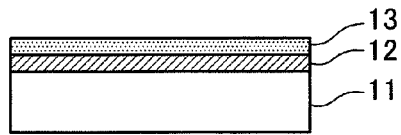
FIGS. 13A to 13H are diagrams for illustrating the manufacturing method of the electroluminescence element to which the exemplary embodiment is applied.

First, on the substrate 11, the anode layer 12 as the first electrode layer, and the dielectric layer 13 are stacked in this order (FIG. 13A: stacking process). In the exemplary embodiment, a glass substrate is used as the substrate 11. Further, ITO is used as a material for forming the anode layer 12, and silicon dioxide ($SiO_2$) is used as a material for forming the dielectric layer 13.

For forming these layers on the substrate 11, a resistance heating deposition method, an electron beam deposition method, a sputtering method, an ion plating method, a CVD method or the like may be used. Alternatively, if a film-forming method, that is, a method for applying a suitable material solved in a solvent to the substrate 11 and then drying the same is applicable, these layers can be formed by a spin coating method, a dip coating method, an ink-jet printing method, a printing method, a spray-coating method and a dispenser-printing method or the like.

Moreover, by executing a surface treatment of the anode layer 12 after forming the anode layer 12, performance of a layer overcoating the anode layer 12 (adhesive property to the anode layer 12, surface smoothness, reduction of barrier to hole injection and the like) may be improved. Examples of methods for the surface treatment include high-frequency plasma treatment, sputtering treatment, corona treatment, UV ozone irradiation treatment, ultraviolet-light irradiation treatment and oxygen plasma treatment.

Further, instead of or in addition to executing the surface treatment of the anode layer 12, an effect similar to the surface treatment may be expected by forming an anode buffer layer which is not shown. In a case where the anode buffer layer is formed by a wet process, the layer may be formed by a coating method such as a spin coating method, a casting method, a micro gravure coating method, a gravure coating method, a bar coating method, a roller coating method, a wire-bar coating method, a dip coating method, a spray coating method, a screen printing method, a flexo printing method, an offset printing method or an ink-jet printing method.

The compounds usable for the aforementioned layer formation by the wet process are not particularly limited as long as the compounds show good adhesion to the anode layer 12 and the light-emitting compounds contained in the light emitting section 17. Examples thereof include conductive polymers such as PEDOT as a mixture of poly-3,4-ethylenedioxythiophene and poly(styrenesulfonic acid) and PANI as a mixture of polyaniline and poly(styrenesulfonic acid). Organic solvents such as toluene and isopropyl alcohol may be added to the conductive polymers. Further, the conductive polymers may contain a third component such as surfactant. The surfactants used herein may contain a group selected from alkyl groups, alkylaryl groups, fluoroalkyl groups, alkylsiloxane groups, sulfates, sulfonates, carboxylates, amides, betaine structures and quaternary ammonium groups. Fluoride-based non-ionic surfactants may also be used.

Further, in a case where the anode buffer layer is formed by a dry process, the layer may be formed by a plasma treatment disclosed as an example in Japanese Patent Application Laid Open Publication No. 2006-303412. In addition, the layer may be formed by a method for forming layers of metal, metal oxides or metal nitrides. Specific examples thereof include an electron-beam deposition method, a sputtering method, a chemical reaction method, a coating method and a vacuum deposition method.

Figure 13B:
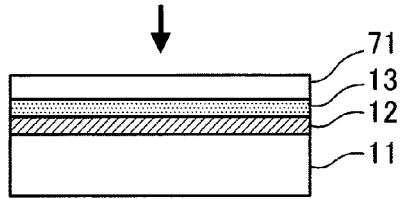

Next, the penetrating parts 16a are formed so as to penetrate each of the layers formed in the process of FIG. 13A. For forming the penetrating parts 16a, a method using lithography may be used, for example. To form the penetrating parts 16a, first, a resist solution is applied on the dielectric layer 13 and then an excess resist solution is removed by spin coating or the like to form a resist layer 71 (FIG. 13B).

Figure 13C:
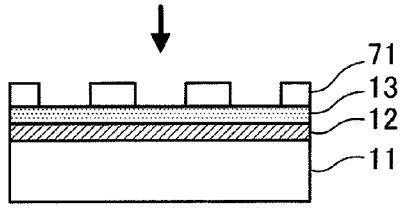

Thereafter, the resist layer 71 is covered with a mask (not shown), in which a predetermined pattern for forming the penetrating parts 16a is rendered, and is exposed with ultraviolet light (UV), an electron beam (EB) or the like. Then, the predetermined pattern corresponding to the recessed parts 16 is exposed onto the resist layer 71. Thereafter, light exposure portions of the resist layer 71 are removed by use of a developing solution, exposed pattern portions of the resist layer 71 are removed (FIG. 13C). By this process, the surface of the dielectric layer 13 is exposed so as to correspond to the exposed pattern portions.

Figure 13D:
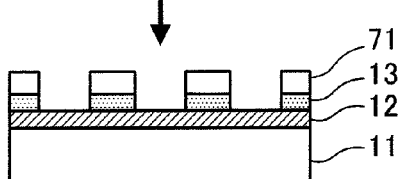

Then, by using the remaining resist layer 71 as a mask, exposed portions of the dielectric layer 13 are removed by etching (FIG. 13D). Either dry etching or wet etching may be used as the etching. Further, by combining isotropic etching and anisotropic etching at this time, the shape of the recessed parts 16 is controllable. Reactive ion etching (RIE) or inductive coupling plasma etching is used as the dry etching, and a method of immersion in diluted hydrochloric acid, diluted sulfuric acid, or the like is used as the wet etching. By the etching, the surface of the anode layer 12 is exposed so as to correspond to the aforementioned pattern.

Figure 13E:
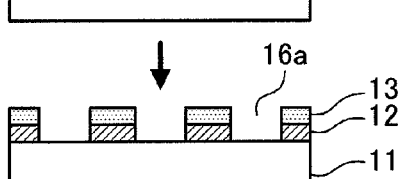

Next, the residual resist layer 71 is removed by using a resist removing solution, and exposed portions of the anode layer 12 are removed by etching while the dielectric layer 13 is used as a mask (FIG. 13E). As for etching, a method similar to the method described with FIG. 13D is usable, however, by changing the etching conditions, the anode layer 12 is selectively etched with less influence on the dielectric layer 13. By this process, the surface of the substrate 11 is exposed so as to correspond to the aforementioned pattern, and the penetrating parts 16a are formed. Note that, respective processes described with FIGS. 13C and 13D may be taken as a penetrating part forming process for forming the penetrating parts 16a that penetrate the anode layer 12 as the first electrode layer and the dielectric layer 13.

Figure 13F:
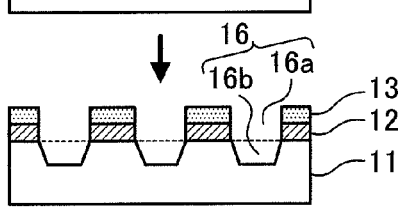

Next, the exposed portions of the substrate 11 are removed by etching while portions other than portions forming the penetrating parts 16a are used as a mask, (FIG. 13F: bored part forming process). As for etching, a method similar to the method described with FIG. 13D is usable, however, by changing the etching conditions, the substrate 11 is selectively etched with less influence on the dielectric layer 13. By this process, the bored parts 16b are formed so as to correspond to the aforementioned pattern, and the recessed parts 16 are formed by combining the bored parts 16b and the penetrating parts 16a. Further, by this method, it is possible to form the bored parts 16b easily since another mask is not necessary to perform lithography.

Note that, in the exemplary embodiment, although the description has been given by taking as an example a case where the bored parts 16b having the cross sectional shape of a trapezoid are formed, by changing the etching conditions, various kinds of shapes mentioned above can be formed. More specifically, by combining isotropic etching and anisotropic etching, it is possible to form various kinds of shapes. Further, in a case where the aforementioned penetrating part forming process and the bored part forming process are performed by dry etching, operation is continuously performed in the same apparatus by changing the etching conditions such as a reactant gas. Meanwhile, in a case where wet etching is performed to form the bored part 16b, if glass is used for the substrate 11, a method of immersion in hydrofluoric acid or the like is usable.

Figure 13G:
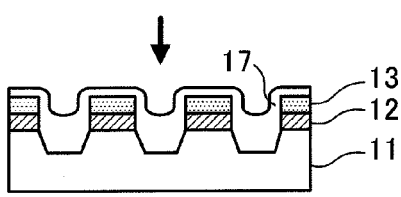

Next, the light emitting sections 17 are formed (FIG. 13G: light emitting section forming process). For forming the light emitting sections 17, the above-mentioned coating method is used. Specifically, light-emitting material solution in which the light-emitting material for the light emitting sections 17 is dispersed in predetermined solvent such as organic solvent or water is firstly applied. To perform coating, various methods such as a spin coating method, a spray coating method, a dip coating method, an ink-jet method, a slit coating method, a dispenser method and a printing method may be used. After the coating is performed, the light-emitting material solution is dried by heating or vacuuming, and thereby the light-emitting material adheres to the inner surface of the recessed part 16 to form the light emitting sections 17. At this time, the light emitting sections 17 are formed so as to spread onto the dielectric layer 13. By adopting this configuration, manufacture of the electroluminescence element 10 is easier than the case where the light emitting sections 17 are formed only at the inside of the recessed parts 16, since it is not necessary to remove the coating liquid applied on the portions other than the recessed parts 16 after the coating.

Figure 13H:
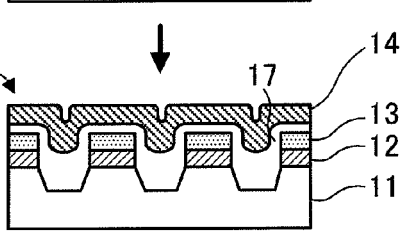

Then, the cathode layer 14 as the second electrode layer is formed so as to be stacked on the light emitting sections 17 (FIG. 13H: second electrode layer forming process). A method similar to the method for forming the anode layer 12 is performed to form the cathode layer 14.

By the aforementioned processes, the electroluminescence element 10 is manufactured. Further, after the sequence of these processes, a protective layer or a protective cover (not shown) for using the electroluminescence element 10 stably for long periods and protecting the electroluminescence element 10 from outside may be mounted. As the protective layer, polymer compounds, metal oxides, metal fluorides, metal borides, or silicon compounds such as silicon nitrides and silicon oxides may be used. A lamination thereof may also be used. As the protective cover, glass plates, plastic plates with a surface treated with low hydraulic permeability, or metals may be used. The protective cover may be bonded to the substrate 11 by using a thermosetting resin or a photo-curable resin to be sealed. At this time, spacers may be used since predetermined spaces may be maintained and the prevention of scratches on the electroluminescence element 10 is facilitated. Filling the spaces with inert gases such as nitrogen, argon and helium prevents the oxidation of the cathode layer 14 on the upper side. Especially, in a case of using helium, high thermal conductivity thereof enables heat generated from the electroluminescence element 10 upon application of voltage to be effectively transmitted to the protective cover. In addition, by putting desiccants such as barium oxide in the spaces, the electroluminescence element 10 is easily prevented from being damaged by moisture absorbed in the sequence of the aforementioned manufacturing processes.

As described above, although the description has been given by taking as an example a case where the electroluminescence is used for light sources of the light emitting sections, the light-emitting element according to the present invention may be manufactured by replacing the light source with another light source having the similar size.

(Image Display Device)

Next, description will be given for an image display device having the aforementioned light-emitting element described in detail.

Figure 14:
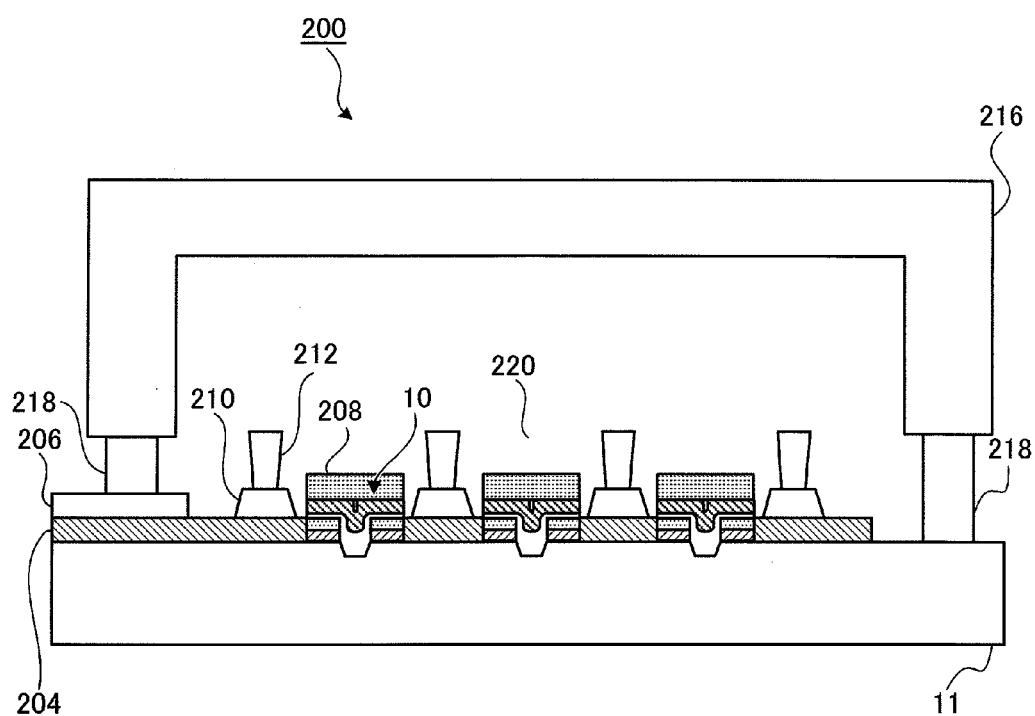
FIG. 14 is a diagram for illustrating an example of an image display device using the electroluminescence element according to the exemplary embodiment.

FIG. 14 is a diagram for illustrating an example of an image display device using the electroluminescence element according to the exemplary embodiment.

An image display device 200 shown in FIG. 14 is a so-called passive matrix image display device, and is provided with an anode wiring 204, an auxiliary anode wiring 206, a cathode wiring 208, an insulating film 210, a cathode partition 212, a shield plate 216, and a sealant 218, in addition to the electroluminescence element 10.

In the exemplary embodiment, plural anode wirings 204 are formed on the substrate 11 of the electroluminescence element 10. The anode wirings 204 are arranged in parallel with certain intervals. The anode wiring 204 is configured with a transparent conductive film, and is made of, for example, ITO (indium tin oxide). The thickness of the anode wiring 204 may be set to, for example, 100 nm to 150 nm. The auxiliary anode wiring 206 is formed on an end portion of each of the anode wirings 204. The auxiliary anode wiring 206 is electrically connected to the anode wirings 204. With such a configuration, the auxiliary anode wiring 206 functions as a terminal for connection to an external wiring on the end portion side of the substrate 11, and accordingly, a current is supplied from a not-shown drive circuit provided outside to the anode wirings 204 through the auxiliary anode wiring 206. The auxiliary anode wiring 206 may be configured with, for example, a metal film having a thickness of 500 nm to 600 nm.

Plural cathode wirings 208 are also provided on the electroluminescence element 10. The plural cathode wirings 208 are arranged in parallel with each other, and each intersecting the anode wirings 204. Aluminum or aluminum alloy may be used for the cathode wiring 208. The thickness of the cathode wirings 208 is, for example, 100 nm to 150 nm. Further, similar to the auxiliary anode wiring 206 for the anode wirings 204, a not-shown auxiliary cathode wiring is provided on an end portion of each of the cathode wirings 208, and is electrically connected to the cathode wirings 208. Consequently, a current is capable of flowing between the cathode wirings 208 and the auxiliary cathode wiring.

Further, on the substrate 11, the insulating film 210 is formed to cover the anode wirings 204. An opening 220 having a rectangular shape is provided in the insulating film 210 to expose a part of the anode wiring 204. Plural openings 220 are arranged in a matrix on the anode wirings 204. The electroluminescence elements 10 are provided at the openings 220 between the anode wirings 204 and the cathode wirings 208. In other words, each opening 220 becomes a pixel. Accordingly, a display region is formed corresponding to the openings 220. Here, the thickness of the insulating film 210 may be set to, for example, 200 nm to 300 nm, and the size of the opening 220 may be set to, for example, 300 μm×300 μm.

As mentioned above, the electroluminescence elements 10 are located between the anode wirings 204 and the cathode wirings 208 at the openings 220. In this case, the anode layers 12 of the electroluminescence elements 10 are in contact with the anode wirings 204, and the cathode layers 14 are in contact with the cathode wirings 208. The thickness of the electroluminescence elements 10 is set to, for example, 150 nm to 200 nm.

On the insulating film 210, plural cathode partitions 212 are formed along the direction perpendicular to the anode wirings 204. The cathode partitions 212 play a role in spatially separating the plural cathode wirings 208 so that the cathode wirings 208 are not electrically connected to each other. Accordingly, each of the cathode wirings 208 is arranged between the adjacent cathode partitions 212. The size of the cathode partition 212 may be, for example, 2 µm to 3 µm in height and 10 µm in width.

The substrate 11 is bonded to the shield plate 216 with the sealing material 218. By this configuration, a space where the electroluminescence element 10 is provided is shielded, and thus the electroluminescence element 10 is prevented from deteriorating due to moisture in the air. As the shield plate 216, for example, a glass substrate having a thickness of 0.7 mm to 1.1 mm may be used.

In the image display device 200 with such a configuration, a current is supplied to the electroluminescence elements 10 via the auxiliary anode wirings 206 and the not-shown auxiliary cathode wirings from a not-shown driving device to cause the light emitting sections 17 (refer to FIG. 1) to emit light. Further the light is output from the recessed parts 16 (refer to FIG. 1) to the outside through the substrate 11. By controlling light emission and non-light emission of the electroluminescence elements 10 corresponding to the aforementioned pixels with the controller, images may be displayed on the image display device 200.

(Illuminating Device)

Next, description will be given for an illuminating device using the electroluminescence elements 10.

Figure 15:
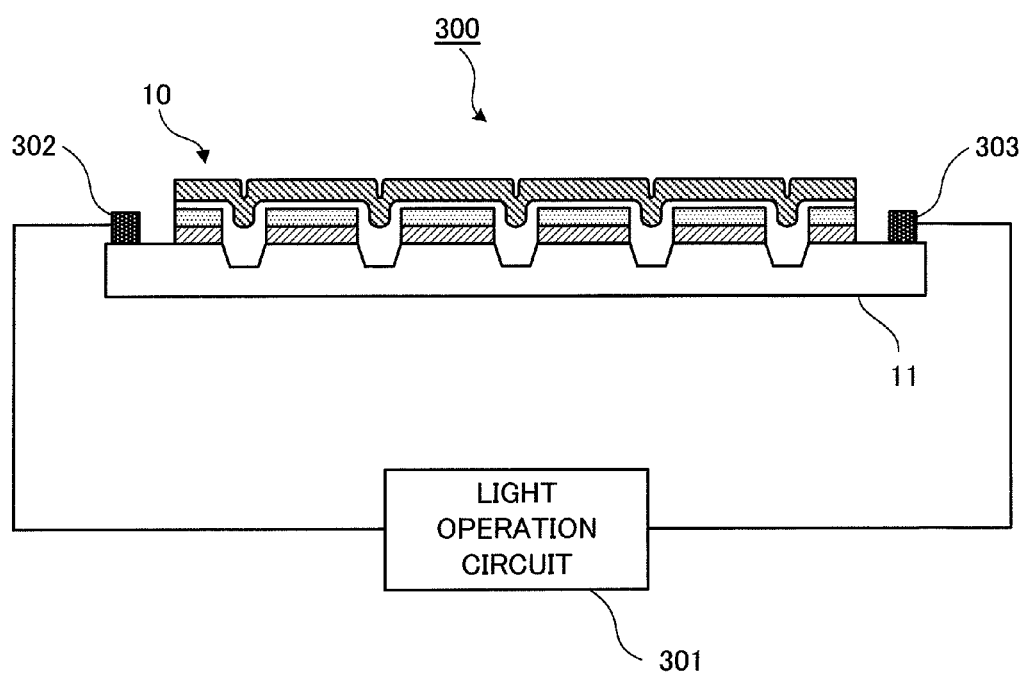
FIG. 15 is a diagram for illustrating an example of an illuminating device having the electroluminescence element according to the exemplary embodiment.

FIG. 15 is a diagram for illustrating an example of an illuminating device having the electroluminescence element according to the exemplary embodiment.

An illuminating device 300 shown in FIG. 15 is configured with: the aforementioned electroluminescence element 10; a terminal 302 that is provided adjacent to the substrate 11 (refer to FIG. 1) of the electroluminescence element 10 and is connected to the anode layer 12 (refer to FIG. 1); a terminal 303 that is provided adjacent to the substrate 11 (refer to FIG. 1) and is connected to the cathode layer 14 (refer to FIG. 1) of the electroluminescence element 10; and a light operation circuit 301 that is connected to the terminals 302 and 303 to drive the electroluminescence element 10.

The light operation circuit 301 has a not-shown DC power supply and a not-shown control circuit inside thereof, and supplies a current between the anode layer 12 and the cathode layer 14 of the electroluminescence element 10 via the terminals 302 and 303. The light operation circuit 301 drives the electroluminescence element 10 to cause the light emitting sections 17 (refer to FIG. 1) to emit light, the light is outputted from the recessed parts 16 to the outside through the substrate 11, and the light is utilized for illumination. The light emitting sections 17 may be configured with the light-emitting material that emits white light, or, it may be possible to provide plural electroluminescence elements 10 using a light-emitting material that radiates each of the green light (G), blue light (B) and red light(R), thus making a synthetic light white. Note that, in the illuminating device 300 according to the exemplary embodiment, when the light emission is performed with small diameter of the recessed parts 16 (refer to FIG. 1) and small intervals between the recessed parts 16, the light emission seems to be surface emitting to the human eyes.

EXAMPLES

Example 1

[Preparation of Phosphorescent Light-Emitting Polymer Compound]

The aforementioned compounds expressed by the chemical formulas E-2 (iridium complex having a polymerizing substituent), E-54 (hole transporting compound) and E-66 (electron transporting compound) are dissolved in dehydrated toluene with the ratio (mass ratio) of E-2:E-54:E-66=1:4:5, and V-601 (manufactured by Wako Pure Chemical Industries, Ltd.) as a polymeric initiator is further dissolved therein. After freeze pumping operation, vacuum seal is performed, and the resultant solution is stirred for 100 hours at 70 degrees C. for polymerization reaction. After the reaction, the reaction solution is delivered by drops into acetone to cause deposition, and then reprecipitation purification with dehydrated toluene—acetone is repeated three times to purify the phosphorescent light-emitting polymer compound. Here, as each of dehydrated toluene and acetone, solution distilled from high-purity solution manufactured by Wako Pure Chemical Industries, Ltd. is used.

By analyzing the solution after the third reprecipitation purification by high-performance liquid chromatography, it is confirmed that any material absorbing light at regions not less than 400 nm is not detected in the solution. In other words, it means that impurities are hardly contained in the solution, and the phosphorescent light-emitting polymer compound is sufficiently purified. Then, the purified phosphorescent light-emitting polymer compound is vacuum-dried for two days at room temperature. The phosphorescent light-emitting polymer (ELP) obtained by this operation is confirmed to have the purity of over 99.9% by the high-performance liquid chromatography (detection wavelength: 254 nm).

[Preparation of Light-Emitting Material Solution]

A light-emitting material solution (hereinafter, also referred to as "solution A") was prepared by dissolving 3 parts by weight of the light-emitting polymer compound prepared as mentioned above (weight-average molecular weight=52000) in 97 parts by weight of xylene.

[Preparation of Light-Emitting Element]

As a light-emitting element, the electroluminescence element 10 shown in FIG. 1 is produced by the method described with FIGS. 13A to 13H.

Specifically, first, on a glass substrate (25 mm per side) having an ITO (indium tin oxide) film of 150 nm in thickness, a silicon dioxide ($SiO_2$) layer of 280 nm in thickness is formed by using a sputtering device (E-401s manufactured by Canon ANELVA Corporation). Here, the glass substrate corresponds to the substrate 11. The ITO film and the silicon dioxide layer correspond to the anode layer 12 and the dielectric layer 13, respectively.

Figure 16:
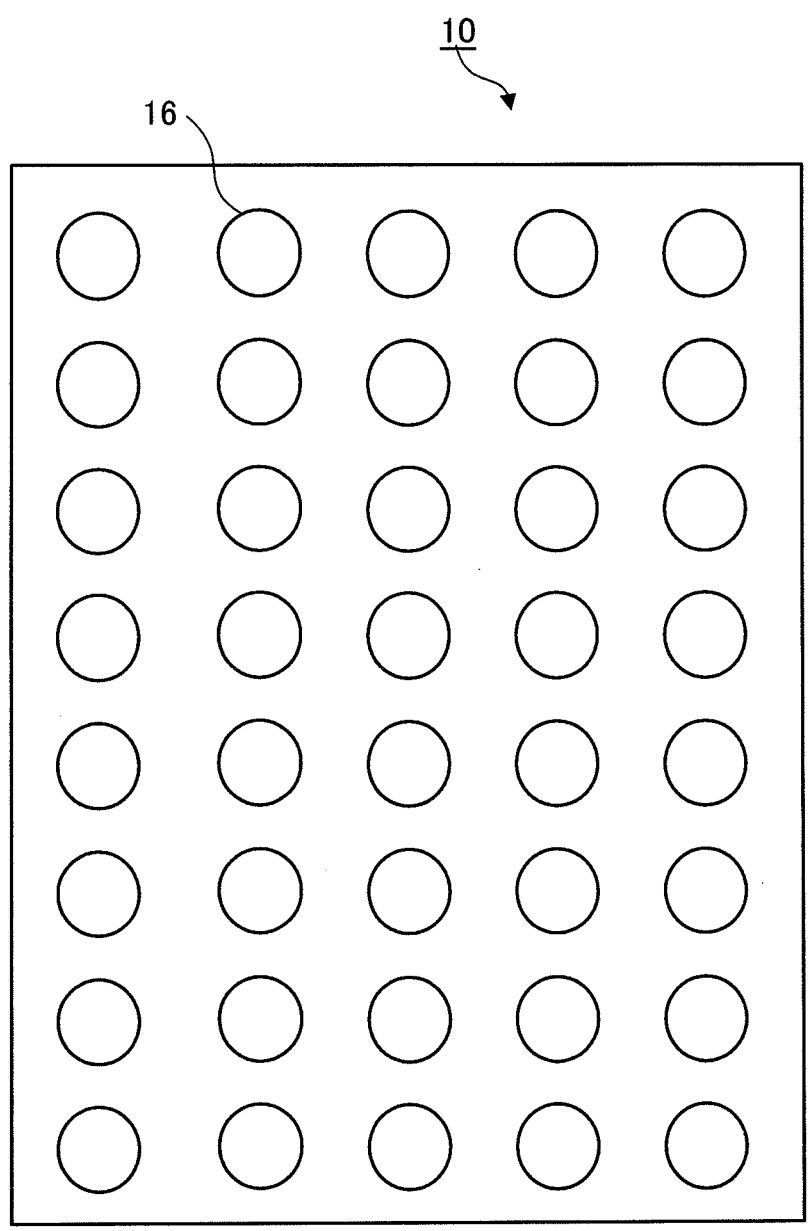
FIG. 16 illustrates the pattern of the recessed parts.

Next, a photoresist (AZ1500 manufactured by AZ Electronic Materials) of about 1 µm in thickness is formed by a spin coating method. After ultraviolet light exposure, development is executed with 1.2% aqueous solution of TMAH (tetramethyl ammonium hydroxide: $(CH_3)_4NOH$) for patterning the resist layer as shown in FIG. 16.

Subsequently, dry etching using a reactive ion etching device (RIE-200iP manufactured by SAMCO Inc.) is performed to pattern the silicon dioxide layer. On this occasion, the etching conditions are: using $CHF_3$ as a reactant gas; and causing a reaction for 16 minutes under a pressure of 0.3 Pa and output bias/ICP=60/100 (W).

Then the residue of the resist is removed by the resist removing solution, and dry etching using the aforementioned reactive ion etching device is performed to pattern the ITO film. On this occasion, the etching conditions are: using a mixed gas of $Cl_2$ and $SiCl_4$ as a reactant gas; and causing a reaction for 7 minutes under a pressure of 1 Pa and output bias/ICP=180/100 (W).

Further, by replacing the reactant gas with $CHF_3$ gas, the reaction is carried out for 20 minutes under a pressure of 0.3 Pa and output bias/ICP=120/100 (W) as the etching conditions.

Next, the glass substrate is washed by spraying pure water and dried by a spin dryer. The dried glass substrate is mounted on the reactive ion etching device (RIE-200iP manufactured by SAMCO Inc.). Then, oxygen gas is introduced into the reactive ion etching device, and oxygen plasma is generated by applying and discharging AC voltage, and is radiated to the glass substrate. Here, the flow rate of oxygen gas introduced into a plasma generator is adjusted, and the treatment is performed for 30 seconds under the pressure of 1 Pa and input power of 150 W. Subsequently, the introduced gas is changed from oxygen gas to $CHF_3$ gas. Here, by controlling the flow rate, the pressure is set at 7 Pa. The treatment is performed for 10 seconds in a PE mode with the input power of 300 W. As a result, the recessed parts 16 having the depth of 200 nm (the depth of the bored parts 16b included therein is 30 nm) and the diameter of 2 μm are formed. In addition, the recessed parts 16 are arranged according to the pattern shown in FIG. 16, and the density thereof is $6 \times 10^4$ per 1 $mm^2$. Note that, locations and the numbers of the light emitting sections 17, penetrating parts 16a and bored parts 16b correspond to each other, and thus the arrangement and density of the light emitting sections 17 are the same as those of the recessed parts 16.

Then the solution A is applied by the spin coating method (spin rate: 3000 rpm), and subsequently, the glass substrate is left under a nitrogen atmosphere at the temperature of 120° C. for an hour, and thus the light-emitting layer including the light emitting sections 17 is formed.

Then, the glass substrate is placed in a vacuum deposition chamber, and a sodium (Na) film having the thickness of 2.0 nm as the cathode buffer layer is formed on the light-emitting layer including the light emitting sections 17 by a vacuum deposition equipment. Subsequently, an aluminum (Al) film having the thickness of 150 nm as the cathode layer 14 is formed. The electroluminescence element 10 can be produced by the aforementioned processes.

Example 2

The electroluminescence element 10 is produced in the same manner as example 1 except that the anode layer 12 is made of a tungsten (W) film.

Comparative Examples 1 & 2

In the comparative example 1, the electroluminescence element is produced in the same manner as example 1 except that the bored parts 16b are not formed. In the comparative example 2, the electroluminescence element is produced in the same manner as example 2 except that the bored parts 16b are not formed.

Examples 3a to 3f

The electroluminescence element 10g shown in FIG. 9 is produced as the light-emitting element in the manner shown in FIGS. 13A to 13H. On this occasion, the electroluminescence element 10g is produced in the same manner as example 1 except that the dry etching conditions for the silicon dioxide layer are: using $CHF_3$ as a reactant gas; causing a reaction for 16 minutes under a pressure of 0.45 Pa and output bias/ICP=60/100 (W); and setting the density of the light emitting sections 17 and the maximum width of the bored parts 16b as shown in Table 1 by adjusting the pattern of the resist layer. Note that, the depth of the bored parts 16b is 80 nm.

Example 4

The electroluminescence element 10a shown in FIG. 3 is produced as the light-emitting element in the manner described with FIGS. 13A to 13H. On this occasion, the electroluminescence element 10a is produced in the same manner as example 1 except that the etching conditions for the etching of the substrate after patterning the ITO film are: causing a reaction for 25 minutes under a pressure of 0.3 Pa and output bias/ICP=120/100 (W); and setting the density of the light emitting sections 17 and the maximum width of the bored parts 16b as shown in Table 1. Note that, the size and density of the recessed parts 16 are the same as those of example 3d.

Example 5

The electroluminescence element 10b shown in FIG. 4 is produced as the light-emitting element in the manner shown in FIGS. 13A to 13H. On this occasion, the electroluminescence element 10b is produced in the same manner as example 1 except that the bored parts 16b are formed on the substrate 11 by wet etching. As the wet etching conditions, the substrate is exposed for one minute by using TP-2 aqueous solution (manufactured by Kanto chemical Co., Inc.) at 25 degrees C. Note that, the size and density of the recessed parts 16 are the same as those in example 3d. In addition, the cross-sectional shape of the bored parts 16b is, similarly to FIG. 4, nearly a part of a circle, but is not a semicircle.

Example 6

The electroluminescence element 10h shown in FIG. 10 is produced as the light-emitting element. On this occasion, the electroluminescence element 10h is produced in the same manner as example 1 except that the dry etching conditions for the substrate after etching the ITO film are: using a mixed gas of Ar and $CHF_3$ as a reactant gas; and causing a reaction for 8 minutes under a pressure of 0.45 Pa and output bias/ICP=80/100 (W). Note that, the size and density of the recessed parts 16 are the same as those of example 3d.

Example 7

Figure 12:
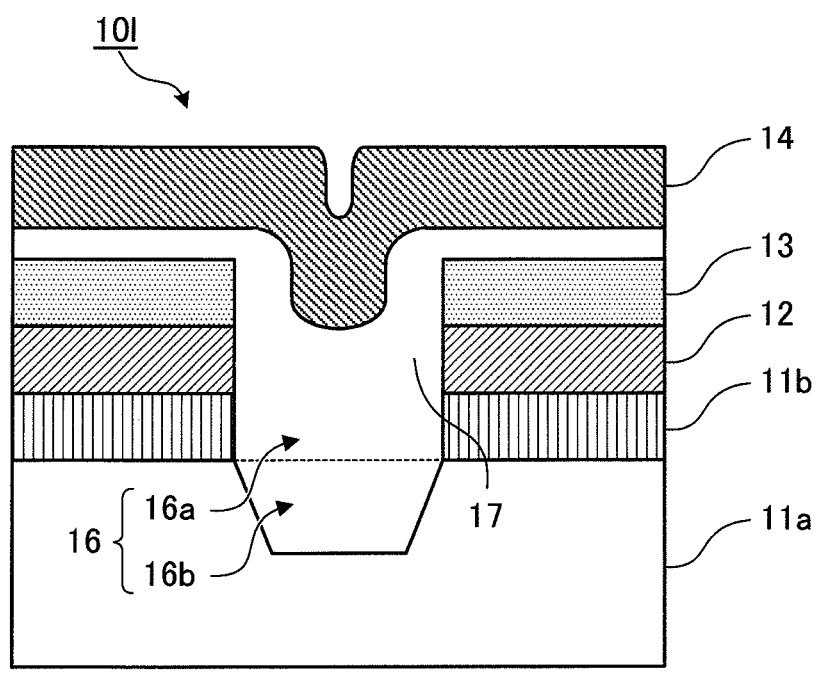
FIG. 12 illustrates, as an example, a case of adopting a configuration in which a low refractive index layer is stacked on the substrate.

The electroluminescence element 10l shown in FIG. 12 is produced as the light-emitting element in the manner described with FIGS. 13A to 13H. On this occasion, a glass substrate having a low refractive index layer (made of $MgF_2$ having refractive index of 1.36) formed on the substrate 11 in the thickness of 100 nm is used. In the dry etching of the substrate 11 including the dry etching of the low refractive index layer 18, a reaction is caused for 40 minutes.

[Characteristic Evaluation]
(Light-Emitting Efficiency)

Voltage is gradually applied to the organic electroluminescence elements produced in examples 1 and 2 and comparative examples 1 and 2 by using a constant-voltage power supply (SM2400 manufactured by Keithley Instruments, KK) to measure a current density flowing in the electroluminescence elements, and the emission intensity at the front side of each of the electroluminescence elements is also measured by a luminance meter (BM-9 manufactured by Topcon corporation). From the ratio of the emission intensity to the current density, the light-emitting efficiency (at the front side) is determined.

Further, in order to compare electroluminescence elements having different light distribution, the light-emitting efficiency after integration for whole direction is also obtained. Each electroluminescence element is fixed at the central part of the inside of an integrating sphere (having a diameter of about 50 cm, made of Ocean Optics, Inc.), and a programmable DC power supply (SM2400, manufactured by Keithley Instruments, KK) is electrically connected to the electrodes.

In this state, voltage is gradually applied to the electroluminescence element from 0 V to 10 V, and the current flowing into the electroluminescence element and light intensity inside the integrating sphere at this time is recorded. From a gradient obtained by plotting the resultant currents and light intensities, current efficiency (QE) is calculated. The integrating sphere has been calibrated in advance by using a standard light source (LS-1-CAL made of Ocean Optics, Inc.). Note that, parts (glass end side and back side) other than the light-emitting surface of the electroluminescence element at the front side are painted with a black coating material, and light emitted from the parts is prevented from leaking to the outside of the electroluminescence element.

(Light Distribution)

The luminance meter (BM-9 manufactured by Topcon corporation) is placed just above the central part of the surface of the produced electroluminescence element intended to be measured (above a normal line passing the center of the surface of the electroluminescence element), and thereby light-emitting luminance of the electroluminescence element is measurable. Voltage is applied to the electroluminescence element by using the constant-voltage power supply (SM2400 manufactured by Keithley Instruments, KK) so that luminance thereof is set at 100 cd/m$^2$. On this occasion, the electroluminescence element is rotated about an axis passing the central part of the electroluminescence element, and the luminance is measured every 2 degrees. Note that, the luminance is shown as a relative value by setting, at 1, the maximum luminance measured at zero degree. In these graphs, zero degree shows a state in which the luminance meter is located just above the surface of the electroluminescence element, and 90 degrees shows a state in which the luminance meter is located on the plane same as the surface of the electroluminescence element.

The measured light distribution patterns are classified as A, B and C mentioned below.

Figure 19:
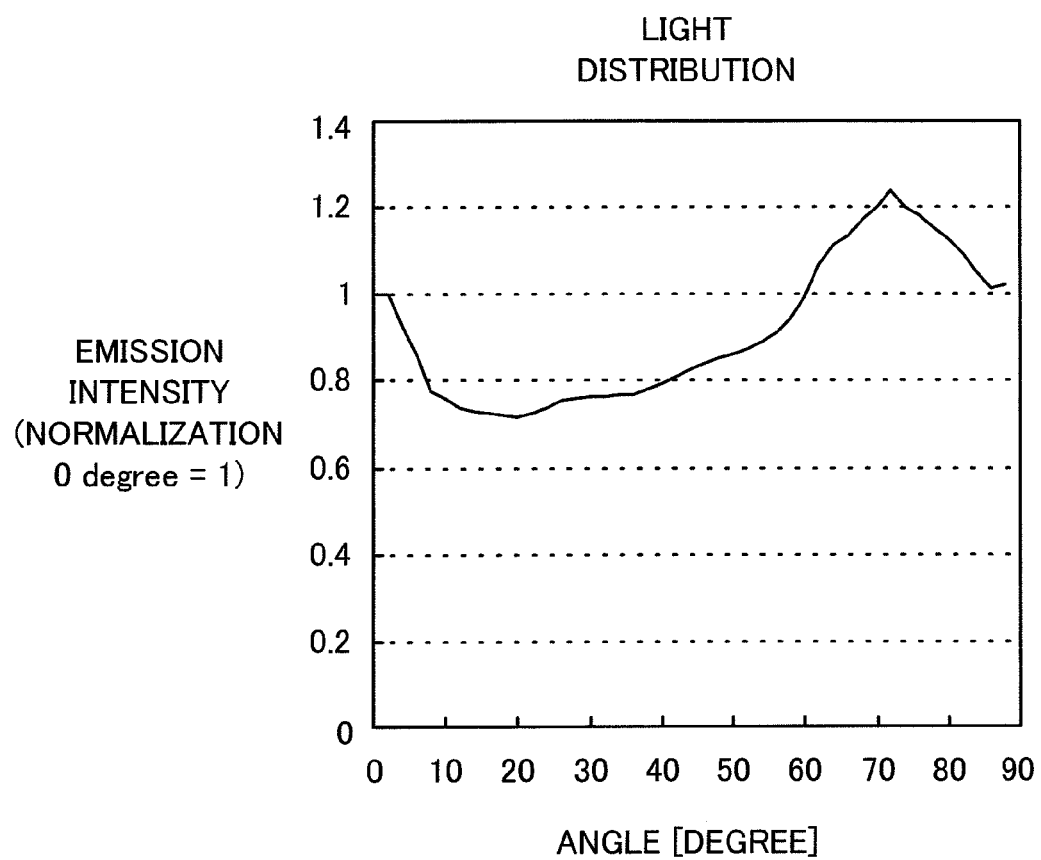
FIG. 19 illustrates the light distribution of the electroluminescence element produced in example 5.

A shows a pattern having a certain level of an emission intensity at every angle, which is exemplified by FIG. 19.

Figure 17:
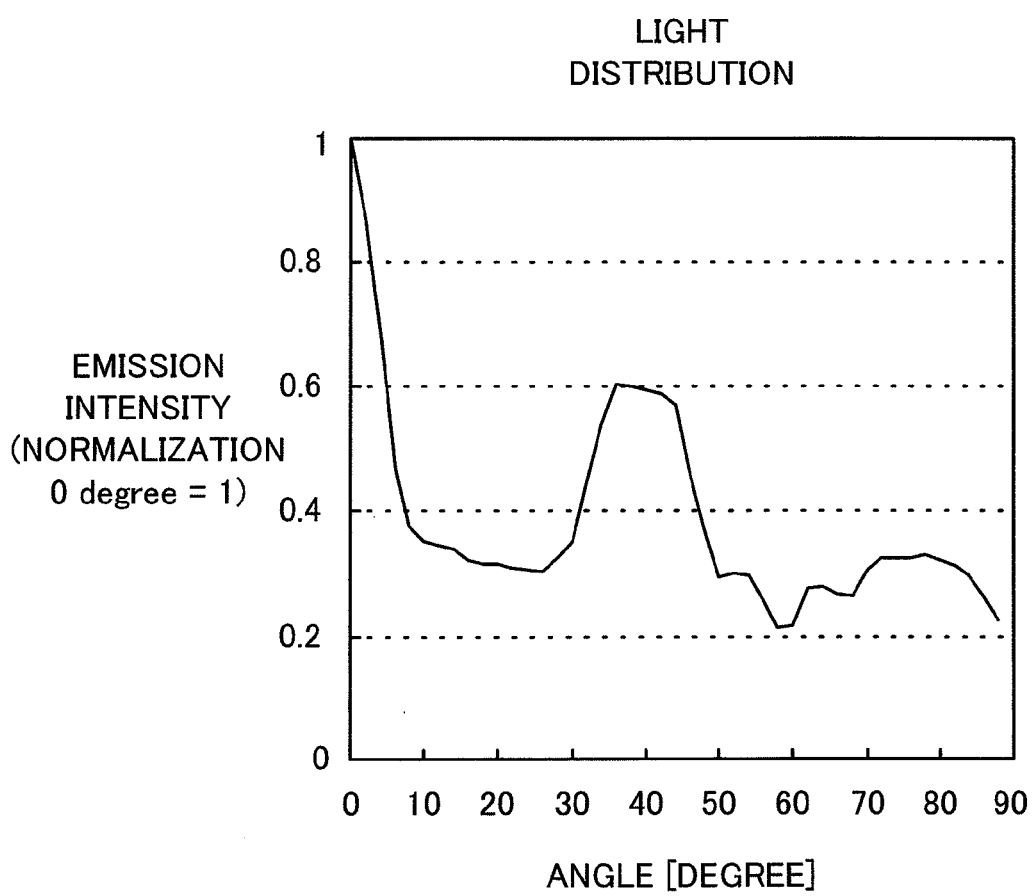
FIG. 17 illustrates the light distribution of the electroluminescence element produced in example 3d.
Figure 20:
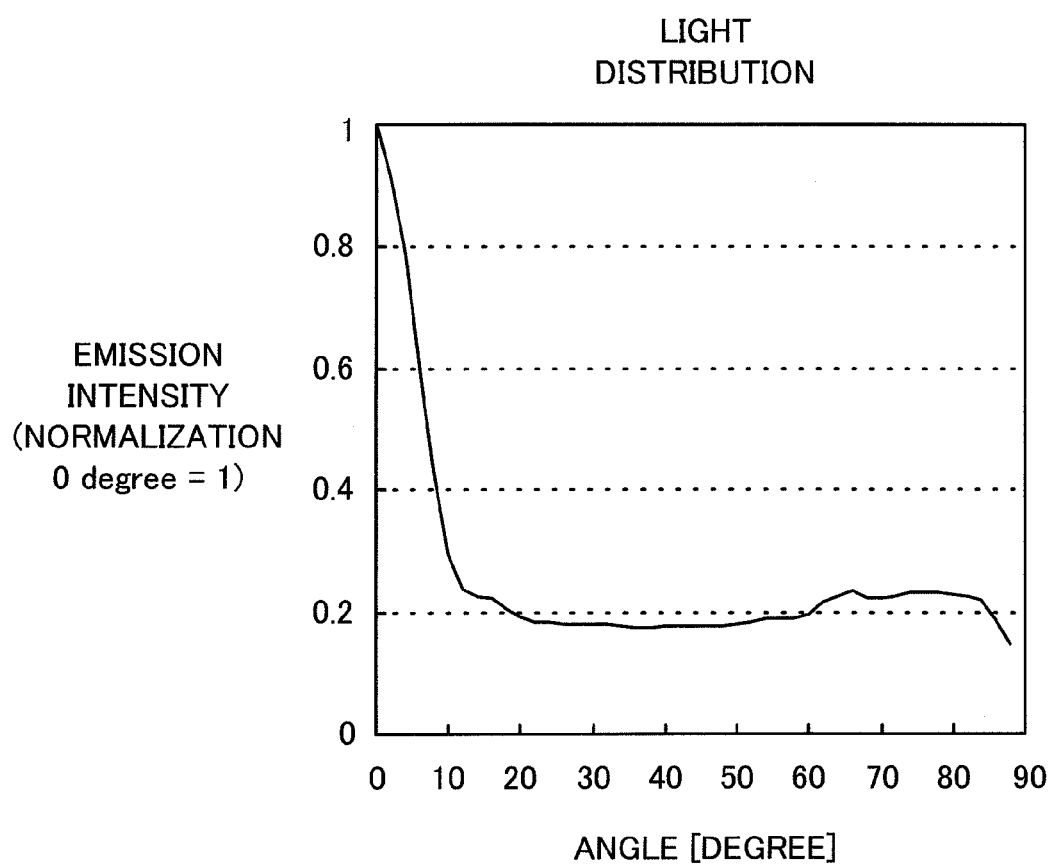
FIG. 20 illustrates the light distribution of the electroluminescence element produced in example 7.

B shows a pattern having a relatively high emission intensity at the front side, which is exemplified by FIGS. 17 and 20.

Figure 18:
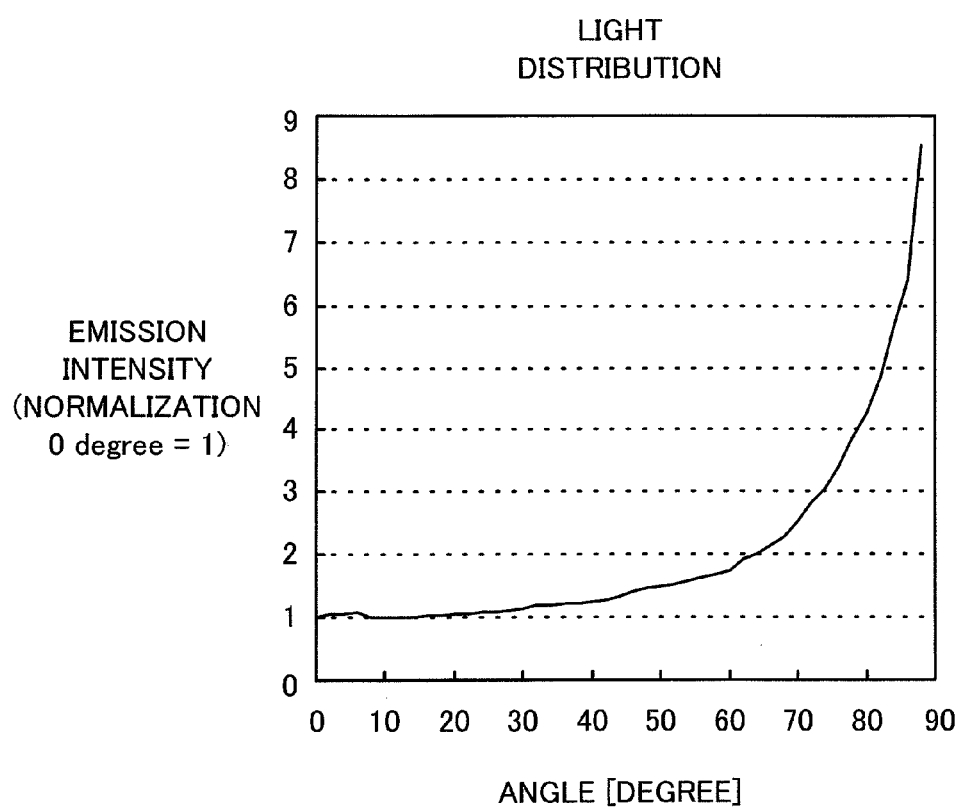
FIG. 18 illustrates the light distribution of the electroluminescence element produced in example 4.

C shows a pattern having a relatively high emission intensity at high angles, which is exemplified by FIG. 18.

Table 1 shows the result.

TABLE 1

| | Configuration of element | Density of light emitting sections [Number/mm$^2$] | Maximum width of bored parts [μm] | Depth of recessed parts [μm] | Depth of bored parts [μm] | Light-emitting efficiency (Front side) [Cd/A] | Light-emitting efficiency (integration for whole direction) [Cd/A] | Light distribution pattern |
|---|---|---|---|---|---|---|---|---|
| Example 1 | FIG. 1 | $6 \times 10^4$ | 2.0 | 0.2 | 0.03 | 22.1 | 21.8 | A |
| Comparative example 1 | FIG. 2C | $6 \times 10^4$ | 2.0 | 0.2 | 0 | 18.2 | 18.0 | A |
| Example 2 | FIG. 1 | $6 \times 10^4$ | 2.0 | 0.2 | 0.03 | 15.2 | 14.9 | A |
| Comparative example 2 | FIG. 2C | $6 \times 10^4$ | 2.0 | 0.2 | 0 | 10.6 | 10.5 | A |
| Example 3a | FIG. 9 | $1 \times 10^4$ | 5.0 | 0.4 | 0.08 | — | 20.8 | A |
| Example 3b | FIG. 9 | $3 \times 10^4$ | 3.0 | 0.4 | 0.08 | — | 21.7 | A |
| Example 3c | FIG. 9 | $2 \times 10^5$ | 1.0 | 0.4 | 0.08 | — | 21.4 | B |
| Example 3d | FIG. 9 | $5 \times 10^5$ | 0.7 | 0.4 | 0.08 | — | 25.6 | B |
| Example 3e | FIG. 9 | $1 \times 10^6$ | 0.5 | 0.4 | 0.08 | — | 28.0 | B |
| Example 3f | FIG. 9 | $6 \times 10^6$ | 0.2 | 0.4 | 0.08 | — | 28.5 | B |
| Example 4 | FIG. 3 | $5 \times 10^5$ | 0.7 | 0.4 | 0.08 | — | 25.2 | C |
| Example 5 | FIG. 4 | $5 \times 10^5$ | 0.7 | 0.4 | 0.08 | — | 26.0 | A |
| Example 6 | FIG. 10 | $5 \times 10^5$ | 0.8*[1] | 0.4 | 0.08 | — | 25.1 | B |
| Example 7 | FIG. 12 | $5 \times 10^5$ | 0.7 | 0.5 | 0.08 | — | 26.0 | B |

*[1]The maximum width of the penetrating parts is 0.7 μm.

Comparing example 1 with comparative example 1 shown in Table 1, it is found that example 1 in which the bored parts 16b are formed has a better light-emitting efficiency. In addition, as for example 2 and comparative example 2, it is found that example 2 in which the bored parts 16b are formed also has a better light-emitting efficiency. From these results, it is obvious that the light-emitting efficiency is better in a case of forming the bored parts 16b than in a case of not forming the bored parts 16b.

From examples 3a to 3f, it is found that, in a case where the maximum width of the bored parts 16b is less than 1 μm, the light-emitting efficiency is further improved.

In the present invention, as shown in Table 1 and FIGS. 17 to 20, light distribution is controllable by adjusting the shape of the bored parts 16b.

For example, as shown in example 5 (FIG. 19), the light-emitting element having the pattern A of the light distribution suits for a general illumination for illuminating a wide range.

Further, in the present invention, even if the light-emitting surface of the light-emitting element is planate, it is possible to produce the light-emitting element having the pattern B of the light distribution, and in particular, it is possible to produce the light-emitting element that emits light to the front side in a beam form like the electroluminescence element of example 7 (FIG. 20).

On the other hand, it is possible to produce the light-emitting element having the pattern C of the light distribution, and in particular, it is possible to produce a light-emitting element having a strong emission intensity approximately only in the direction of the light-emitting surface while suppressing the emission intensity at the front side, like the light-emitting element of example 4 (FIG. 18).

REFERENCE SIGNS LIST

10 ... Electroluminescence element
11 ... Substrate
12 ... Anode layer
13 ... Dielectric layer
14 ... Cathode layer
16 ... Recessed part
16a ... Penetrating part
16b ... Bored part
17 ... Light emitting section
18 ... Low refractive index layer
200 ... Image display device
300 ... Illuminating device

The invention claimed is:

1. A light-emitting element having a substrate that is transparent and on which a plurality of light emitting sections are distributed, the light-emitting element comprising:
a bored part which is included in the substrate, and is formed by recessing, below a light emitting section, a surface of the substrate on a light emitting section side, wherein the light-emitting element is an electroluminescence element;
said light-emitting element further comprising:
a first electrode layer that is stacked on the substrate, and a second electrode layer that is stacked above the first electrode layer; and
a penetrating part that is formed on the bored part and penetrates the first electrode layer from the bored part, wherein the plurality of light emitting sections are each included in the penetrating part.

2. The light-emitting element according to claim 1, wherein the number of the plurality of light emitting sections formed on the surface of the substrate per 1 mm$^2$ is not less than $10^2$.

3. The light-emitting element according to claim 1, wherein the substrate includes a plurality of bored parts, and each of the plurality of bored parts is formed below each of the plurality of light emitting sections on a one-to-one basis.

4. The light-emitting element according to claim 3, wherein the plurality of the bored parts are aligned with each other on the surface of the substrate so that a plurality of long sides are approximately in parallel to each other.

5. The light-emitting element according to claim 1, wherein the bored part has a tapered shape at least in a part of an area from the surface of the substrate to a deepest portion of the bored part.

6. The light-emitting element according to claim 4, wherein the tapered shape has a width that becomes continuously narrower.

7. The light-emitting element according to claim 4, wherein the tapered shape has a width that becomes continuously wider.

8. The light-emitting element according to claim 1, wherein a width of the bored part is approximately the same from the surface of the substrate to a deepest portion of the bored part.

9. The light-emitting element according to claim 8, wherein the bored part is formed into a cuboid-like shape.

10. The light-emitting element according to claim 1, wherein a deepest portion of the bored part is a plane surface.

11. The light-emitting element according to claim 1, wherein a deepest portion of the bored part is a curved surface.

12. The light-emitting element according to claim 1, wherein a deepest portion of the bored part has a pointed shape end.

13. The light-emitting element according to claim 1, wherein the bored part has a convex bottom.

14. The light-emitting element according to claim 1, wherein the bored part is formed into a cylinder-like shape.

15. The light-emitting element according to claim 1, wherein the bored part is formed into a shape other than a solid of revolution.

16. The light-emitting element according to claim 1, wherein a maximum width of the bored part at the surface of the substrate is in a range of 0.01 μm to 5 μm.

17. The light-emitting element according to claim 16, wherein the maximum width of the bored part at the surface of the substrate is not less than 0.01 μm and is less than 1 μm.

18. The light-emitting element according to claim 1, wherein a refractive index of the substrate is less than a refractive index of the plurality of light emitting sections.

19. The light-emitting element according to claim 1, wherein the plurality of light emitting sections include a luminescent material made of an organic compound.

20. The light-emitting element according to claim 19, wherein the plurality of light emitting sections include a luminescent material made of an organic metal complex.

21. The light-emitting element according to claim 19, wherein the plurality of light emitting sections include an organic material emitting phosphorescent light.

22. The light-emitting element according to claim 1, wherein a dielectric layer is formed between the first electrode layer and the second electrode layer.

23. The light-emitting element according to claim claim 1, wherein the penetrating part further penetrates the second electrode layer.

24. The light-emitting element according to claim 1, wherein a width of the penetrating part is not more than 10 μm.

25. The light-emitting element according to claim 1, wherein a maximum width of the penetrating part is in a range of 0.01 μm to 5 μm.

26. The light-emitting element according to claim 1, wherein the width of the penetrating part coincides with a width of the bored part.

27. The light-emitting element according to claim 1, wherein the penetrating part is formed into a cylinder-like shape.

28. The light-emitting element according to claim 1, wherein the penetrating part is formed into a cuboid-like shape.

29. The light-emitting element according to claim 28, wherein the penetrating part is aligned with other penetrating parts on the surface of the substrate so that a plurality of long sides are approximately in parallel to each other.

30. The light-emitting element according to claim claim 1, wherein a sidewall that spreads from the penetrating part to the bored part is formed in a continuous surface.

31. The light-emitting element according to claim 1, wherein at least one of the first electrode layer and the second electrode layer is made of an opaque material.

32. A manufacturing method of the light-emitting element according to claim 1, comprising:
a stacking process for stacking at least a first electrode layer and a dielectric layer on a transparent substrate;

a penetrating part forming process for forming a penetrating part that penetrates at least the first electrode layer and the dielectric layer;

a bored part forming process for forming a bored part on the substrate by using, as a mask, a part of the layers other than a part where the penetrating part is formed;

a light emitting section forming process for forming a light emitting section on an interior surface of the penetrating part; and a second electrode layer forming process for forming a second electrode layer.

33. The manufacturing method of the light-emitting element according to claim 32, wherein the second electrode layer forming process is a process for forming the second electrode layer on the light emitting section.

34. The manufacturing method of the light-emitting element according to claim 32, wherein at least one of the penetrating part forming process and the bored part forming process is a process for forming corresponding one of the penetrating part and the bored part by dry etching.

35. An image display device comprising:
the light-emitting element according to claim 1.

36. An illuminating device comprising:
the light-emitting element according to claim 1.

37. The light-emitting element according to claim 1, wherein the penetrating part reaches the second electrode layer.

* * * * *